US 011114377B2

(12) United States Patent
Tanaka

(10) Patent No.: US 11,114,377 B2
(45) Date of Patent: Sep. 7, 2021

(54) TRANSFORMER, TRANSFORMER MANUFACTURING METHOD AND SEMICONDUCTOR DEVICE

(71) Applicant: Mitsubishi Electric Corporation, Tokyo (JP)

(72) Inventor: Kan Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/053,835

(22) Filed: Aug. 3, 2018

(65) Prior Publication Data

US 2019/0189557 A1    Jun. 20, 2019

(30) Foreign Application Priority Data

Dec. 19, 2017 (JP) .............................. JP2017-242902

(51) Int. Cl.
*H01L 23/522* (2006.01)
*H01F 41/04* (2006.01)
(Continued)

(52) U.S. Cl.
CPC ..... *H01L 23/5227* (2013.01); *H01F 17/0033* (2013.01); *H01F 41/04* (2013.01);
(Continued)

(58) Field of Classification Search
CPC ........ H01F 41/04; H01F 41/061; H01F 41/63; H01F 17/0033; H01L 28/10;
(Continued)

(56) References Cited

U.S. PATENT DOCUMENTS 6,429,764 B1    8/2002 Karam et al.
8,130,067 B2 *  3/2012 Lee .................. H01L 23/645
                                                 336/200
(Continued)

FOREIGN PATENT DOCUMENTS

CN      106898607 A     6/2017
JP      2000-353617 A  12/2000
(Continued)

OTHER PUBLICATIONS

An Office Action; "Notice of Reasons for Refusal," mailed by the Japanese Patent Office dated Sep. 1, 2020, which corresponds to Japanese Patent Application No. 2017-242902 and is related to U.S. Appl. No. 16/053,835 with English language translation.

(Continued)

*Primary Examiner* — David Vu
*Assistant Examiner* — Brandon C Fox
(74) *Attorney, Agent, or Firm* — Studebaker & Brackett PC

(57) ABSTRACT

A semiconductor device includes a semiconductor substrate, an insulating layer, a transformer formed in the insulating layer, and a wiring. The transformer includes a primary winding conductor, and a secondary winding conductor. The primary winding conductor is provided in a quadrangle spiral shape having a first center axis extending in a direction parallel to the surface of the semiconductor substrate inside the insulating layer, and configured by one conductor film selected from a group consisting of a vacuum deposition film, a chemical vapor deposition film and a sputtered film. The secondary winding conductor is provided in a quadrangle spiral shape having a second center axis inside the insulating layer while being spaced from the primary winding conductor in plan view of the semiconductor substrate, (Continued)

magnetically coupled with the primary winding conductor and configured by a conductor film.

15 Claims, 31 Drawing Sheets

(51) Int. Cl.
| | |
|---|---|
| *H01F 17/00* | (2006.01) |
| *H01F 27/32* | (2006.01) |
| *H01L 49/02* | (2006.01) |
| *H01L 21/285* | (2006.01) |
| *H01F 41/063* | (2016.01) |
| *H01F 41/061* | (2016.01) |
| *H01F 38/00* | (2006.01) |
| *H01F 27/28* | (2006.01) |

(52) U.S. Cl.
CPC ......... *H01F 41/041* (2013.01); *H01F 41/042* (2013.01); *H01F 41/061* (2016.01); *H01F 41/063* (2016.01); *H01L 21/28556* (2013.01); *H01L 28/10* (2013.01); *H01F 27/2804* (2013.01); *H01F 27/323* (2013.01); *H01F 2017/0086* (2013.01); *H01F 2027/2809* (2013.01); *H01F 2038/006* (2013.01)

(58) Field of Classification Search
CPC ............... H01L 23/5227; H01F 41/041; H01L 21/28556; H01L 41/042
USPC ....................................................... 257/531
See application file for complete search history.

(56) References Cited

U.S. PATENT DOCUMENTS

| | | | | |
|---|---|---|---|---|
| 8,378,776 | B1* | 2/2013 | Gabrys | H01L 23/5223 |
| | | | | 336/200 |
| 8,826,514 | B2* | 9/2014 | Papavasiliou | H01F 17/0013 |
| | | | | 29/602.1 |
| 9,251,948 | B2* | 2/2016 | Barry | H01F 27/00 |
| 2003/0070282 | A1* | 4/2003 | Hiatt | H01F 41/34 |
| | | | | 29/602.1 |
| 2006/0220777 | A1* | 10/2006 | Nakahori | H02M 3/28 |
| | | | | 336/212 |
| 2014/0285300 | A1* | 9/2014 | Dinulovic | H01F 27/29 |
| | | | | 336/146 |
| 2017/0148732 | A1* | 5/2017 | Kuwajima | H01L 23/5226 |
| 2018/0130867 | A1* | 5/2018 | Lambkin | H01F 41/122 |
| 2019/0072374 | A1* | 3/2019 | Mann | G01B 7/24 |

FOREIGN PATENT DOCUMENTS

| | | |
|---|---|---|
| JP | 2012-204815 A | 10/2012 |
| JP | 2012-227352 A | 11/2012 |

OTHER PUBLICATIONS

An Office Action mailed by China National Intellectual Property Administration dated Dec. 2, 2020, which corresponds to Chinese Patent Application No. 201811532803.6 and is related to U.S. Appl. No. 6/053,835; with English language translation.

An Office Action mailed by the state Intellectual Property Office of the People's Republic of China dated Jun. 22, 2021, which corresponds to Chinese Patent Application No. 201811532803.6 and is related to U.S. Appl. No. 16/053,835; with English language translation.

"Practical Technology of Electronic Product Manufacturing Engineering" edited by Cheng Jie; Aug. 31, 2015; Chapter 4; pp. 113-128; with English language translation of the Office Action which explains this reference.

* cited by examiner

FIG. 2
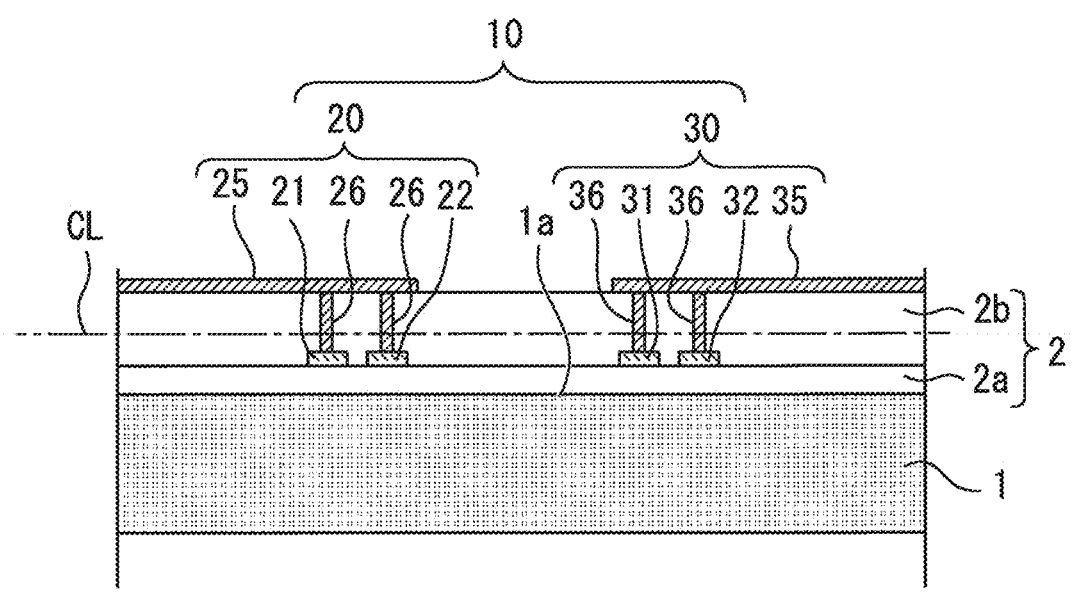
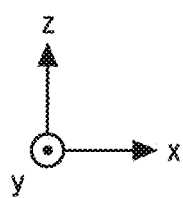

F I G. 3
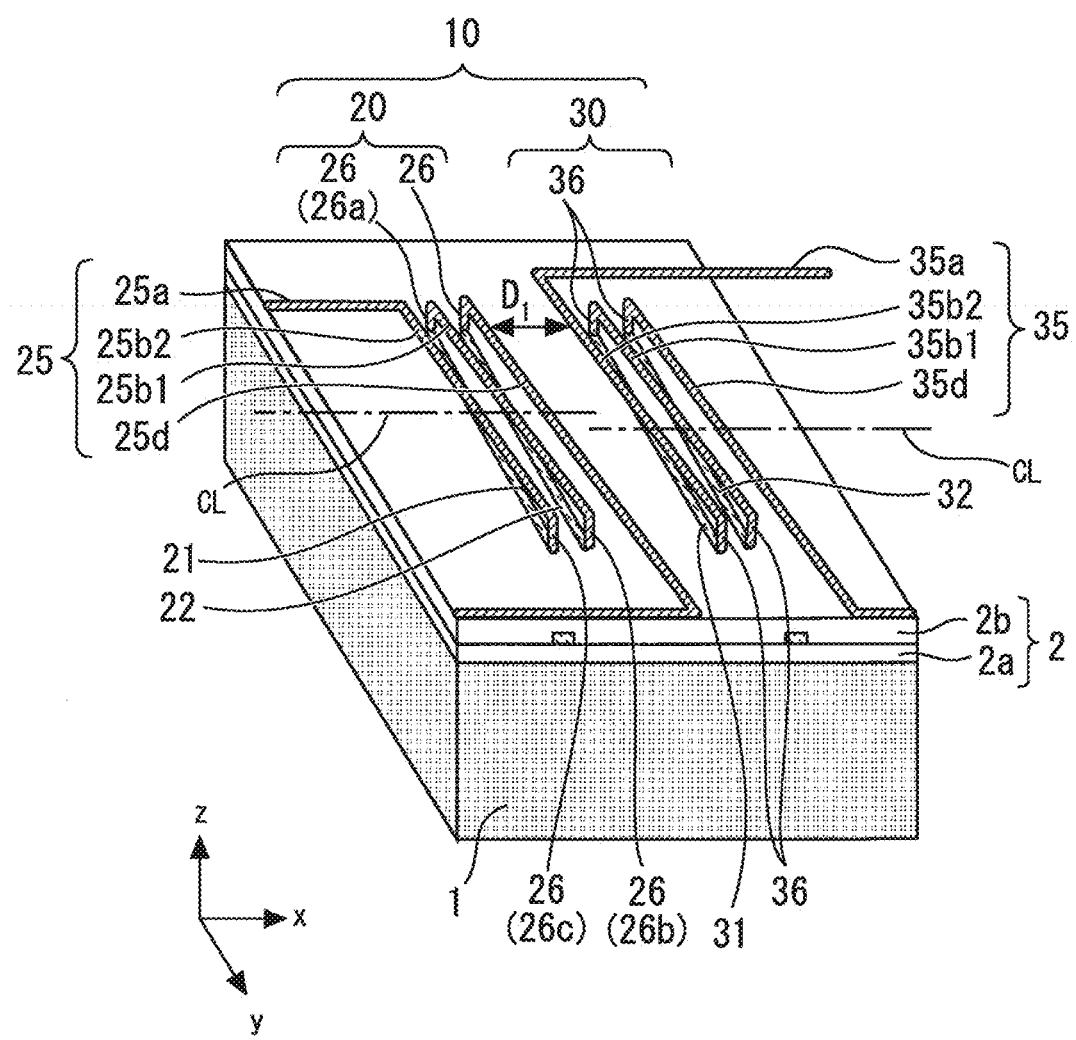

TRANSFORMER, TRANSFORMER MANUFACTURING METHOD AND SEMICONDUCTOR DEVICE

FIELD

The present invention relates to a transformer, a transformer manufacturing method and a semiconductor device.

BACKGROUND

A technique for forming a transformer by providing a conductive material on a semiconductor substrate is known as disclosed in JP 2000-353617 A. The transformer according to the foregoing publication includes linear segments formed of a conductive material, and arches formed of a conductive material as shown in FIG. 9. More specifically, as grasped from FIG. 9 and FIG. 11 of the foregoing publication, the plural linear segments are connected to the plural arches, thereby forming an inductor having a three-dimensional spiral shape. A direction penetrating through the paper surface of FIG. 9 is a direction parallel to the surface of the semiconductor substrate. The inductor of the foregoing publication has a three-dimensional spiral shape having a center axis in the direction penetrating through the paper surface of FIG. 9, and this three-dimensional spiral shape contains curved portions caused by the arches.

A process of manufacturing an inductor constituting a transformer is described from paragraph 0043 to paragraph 0060 of the foregoing publication. It should be noted here that the foregoing publication presupposes an electrolytic growth process. In the foregoing publication, as described in paragraph 0044, plural grooves are first formed on the substrate. Subsequently, as described in paragraph 0048, the plural grooves are filled with metal by the electrolytic growth process, thereby forming plural linear segments. Furthermore, in the foregoing publication, as described in paragraph 0057 and subsequent paragraphs thereto, plural arch-shaped conductor structures are formed above the plural linear segments by the electrolytic growth process. The plural arch-shaped conductor structures are connected to the plural linear segments, thereby forming an inductor having a three-dimensional spiral shape. As described above, the technique disclosed in the foregoing publication relates to formation of a winding structure of the transformer by the electrolytic growth process.

Patent Literature 1: JP 2000-353617 A

The electrolytic growth process is essential in the foregoing conventional technique. However, the electrolytic growth process is not a wiring formation process which is frequently used to form wirings of existing semiconductor devices. Considering a manufacturing efficiency under application to the existing semiconductor devices, the foregoing conventional technique has still had a room for improvement.

SUMMARY

The present invention has been made to solve the foregoing problem, and has an object to provide a transformer, a transformer manufacturing method and a semiconductor device that can enhance a manufacturing efficiency.

A transformer manufacturing method according to a first aspect of the present disclosure includes the steps of: laminating a lower insulating layer on a surface of a semiconductor substrate; laminating a first conductor film on the lower insulating layer by a vacuum deposition method, a chemical vapor deposition method or sputtering; subjecting the first conductor film to patterning to form a first lower linear conductor and a second lower linear conductor that are arranged side by side so as to be spaced from each other in plan view of the semiconductor substrate. The transformer manufacturing method further includes the steps of: laminating an upper insulating layer on the lower insulating layer in which the first lower linear conductor and the second lower linear conductor are formed; providing a plurality of contact vias penetrating through the upper insulating layer so that the plurality of contact vias reach a first end and a second end of the first lower linear conductor and a third end and a fourth end of the second lower linear conductor. The first and is adjacent to the third end, and the second end is adjacent to the fourth end. The transformer manufacturing method further includes the steps of: laminating a second conductor film on the upper insulating layer by the vacuum deposition method, the chemical vapor deposition method or the sputtering; and subjecting the second conductor film to patterning to form a first upper linear conductor and a second upper linear conductor so that the first upper linear conductor and the second upper linear conductor are in contact with the plurality of contact vias. The first upper linear conductor is formed so as to connect a first contact via positioned at the first end of the first lower linear conductor to the second contact via positioned at the fourth end of the second lower linear conductor. The second upper linear conductor is formed so as to connect with a third contact via positioned at the second end of the first lower linear conductor. The first lower linear conductor, the second lower linear conductor, the first upper linear conductor and the second upper linear conductor are connected to one another via the plurality of contact vias, thereby forming a winding conductor. The winding conductor has a quadrangle spiral shape having a center axis extending in a direction parallel to the surface of the semiconductor substrate.

A transformer according to a second aspect of the present disclosure includes: a semiconductor substrate; an insulating layer laminated on a surface of the semiconductor substrate; a primary winding conductor and a secondary winding conductor. The primary winding conductor is provided in a quadrangle spiral shape having a center axis extending in a direction parallel to the surface of the semiconductor substrate inside the insulating layer, and is configured by a conductor film selected from a group consisting of a vacuum deposition film, a chemical vapor deposition film and a sputtered film. The secondary winding conductor is provided in a quadrangle spiral shape having the center axis inside the insulating layer while being spaced from the primary winding conductor in plan view of the semiconductor substrate. The secondary winding conductor is magnetically coupled with the primary winding conductor and is configured by the conductor film selected from the group.

A semiconductor device according to a third aspect of the present disclosure includes: a semiconductor substrate; an insulating layer laminated at a first part of a surface of the semiconductor substrate; a transformer formed in the insulating layer, and a wiring provided on a second part of the surface of the semiconductor substrate. Wherein, the transformer includes a primary winding conductor that is provided in a quadrangle spiral shape having a center axis extending in a direction parallel to the surface of the semiconductor substrate inside the insulating layer, and a secondary winding conductor that is provided in the quadrangle spiral shape having the center axis inside the insulating layer while being spaced from the primary winding conductor in plan view of the semiconductor substrate, and magnetically coupled with the primary winding conductor. The wiring, the primary winding conductor and the secondary winding conductor are configured by a conductor film selected from a group consisting of a vacuum deposition film, a chemical vapor deposition film and a sputtered film.

Other and further objects, features and advantages of the invention will appear more fully from the following description.

BRIEF DESCRIPTION OF DRAWINGS

FIG. 2 is an enlarged cross-sectional view of a transformer according to the embodiment;

FIG. 3 is a perspective view showing a transformer according to the embodiment;

DESCRIPTION OF EMBODIMENT

Configuration of Device of Embodiment

Figure 1:
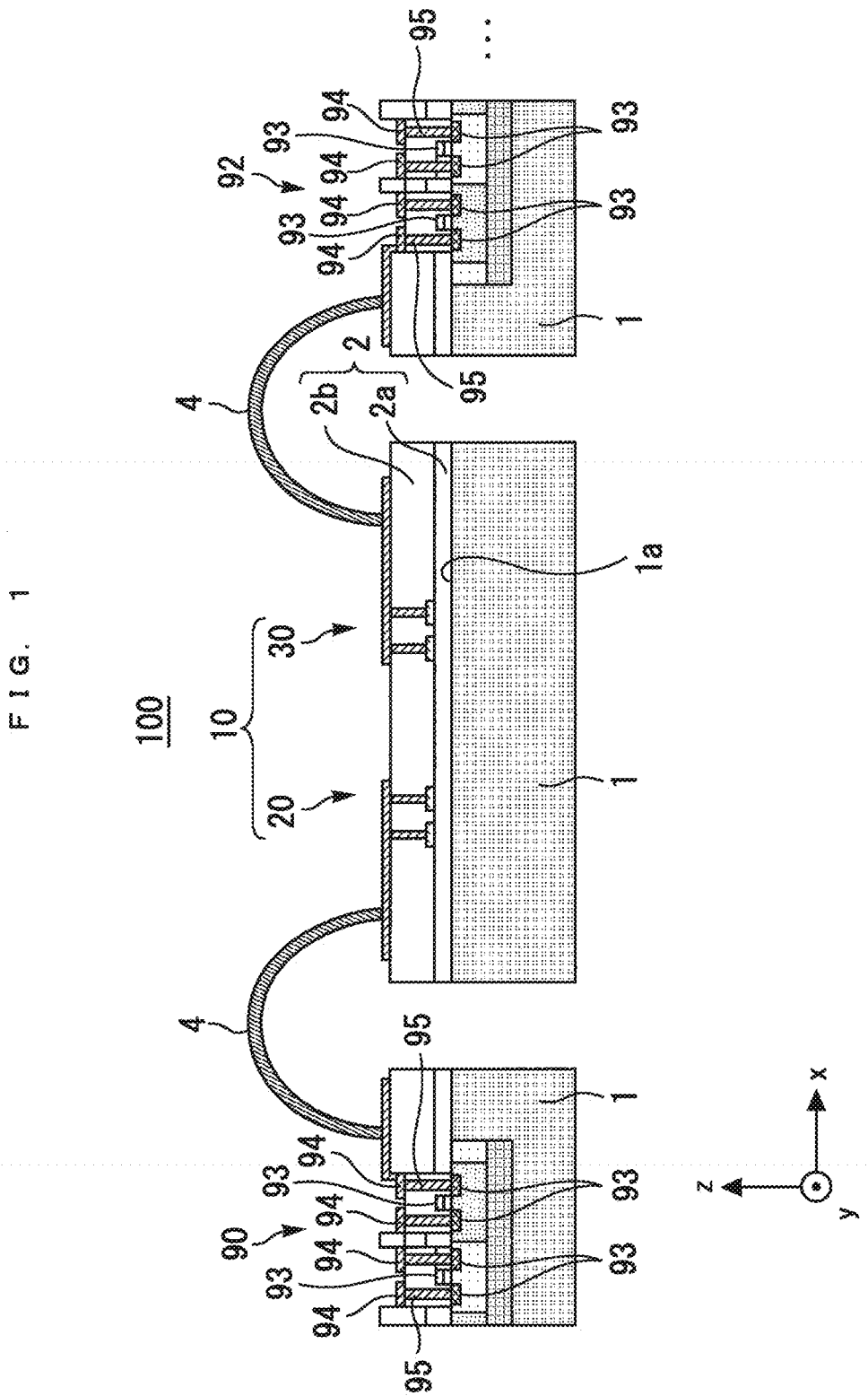
FIG. 1 is a diagram showing a transformer and a semiconductor device according to an embodiment.

FIG. 1 is a diagram showing a horizontal micro-transformer 10 and a semiconductor device 100 according to an embodiment. FIG. 2 is an enlarged cross-sectional view of the horizontal micro-transformer 10 according to the embodiment. For convenience of description, xyz rectangular coordinate axes are shown in FIG. 2.

The semiconductor device 100 includes a semiconductor substrate 1, an insulating layer 2 laminated on the surface 1a of the semiconductor substrate 1, and the horizontal micro-transformer 10 provided inside the insulating layer 2. Furthermore, the semiconductor device 100 includes a low potential side circuit 90 connected to the horizontal micro-transformer 10 via a wire 4, and a high potential side circuit 92 connected to the horizontal micro-transformer 10 via a wire 4. The horizontal micro-transformer 10 contains a primary winding conductor 20 and a secondary winding conductor 30. Each of the low potential side circuit 90 and the high potential side circuit 92 has a lower layer wiring 93, a wiring via 95 and an upper layer wiring 94.

The semiconductor substrate 1 is a silicon substrate. The semiconductor substrate 1 may be a wide bandgap semiconductor substrate having a larger bandgap than silicon. The wide bandgap semiconductor substrate may be an SiC substrate, a GaN substrate or a diamond substrate.

As described later, the insulating layer 2 contains a lower insulating layer 2a and an upper insulating layer 2b. The primary winding conductor 20 is provided in a quadrangle spiral shape having a center axis CL inside the insulating layer 2. The center axis CL is an axis extending in a direction parallel to the surface 1a of the semiconductor substrate 1. The secondary winding conductor 30 is spaced from the primary winding conductor 20 in plan view of the semiconductor substrate 1. The secondary winding conductor 30 is provided in a quadrangle spiral shape having the other center axis CL in parallel to the center axis CL of the primary winding conductor 20 inside the insulating layer 2. The primary winding conductor 20 and the secondary winding conductor 30 are magnetically coupled with each other. The primary winding conductor 20 and the secondary winding conductor 30 are configured by a conductor film. The conductor film constituting the primary winding conductor 20 and the secondary winding conductor 30 is one conductor film selected from the group consisting of a vacuum deposition film, a chemical vapor deposition film and a sputtered film. It is preferable that the conductor film constituting the primary winding conductor 20 and the secondary winding conductor 30 is formed of a conductive material having low resistance. Such a conductive material having low resistance may be metal, doped polycrystalline Si or the like.

The semiconductor device 100 according to the embodiment is a driving circuit for driving a power semiconductor device (not shown). The semiconductor device 100 is a device for supplying a driving signal to a control terminal of the power semiconductor device. This type of device is also called as a gate driver. The semiconductor device 100 uses the horizontal micro-transformer 10 as a level shift circuit. The horizontal micro-transformer 10 performs level shift on the driving signal from the low potential side circuit 90 to transmit the driving signal to the high potential side circuit 92. By the level shift, a high potential driving signal to be supplied to the control terminal of the power semiconductor device is generated. The primary winding conductor 20 is a signal transmission end portion for transmitting a low potential driving signal. The secondary winding conductor 30 is a signal reception end portion for receiving the level-shifted high potential driving signal.

FIG. 3 is a perspective view showing the horizontal micro-transformer 10 according to the embodiment. In FIG. 3, for convenience of description, the primary winding conductor 20 and the secondary winding conductor 30 are wholly shown by solid lines while seeing through the insulating layer 2. Here, the relationship between the xyz rectangular coordinate axes indicated in the figures, and the horizontal micro-transformer 10 and the semiconductor device 100 will be described. The z-axis direction is a normal vector direction of the surface 1a of the semiconductor substrate 1. The z-axis direction is a thickness direction of the insulating layer 2 when the insulating layer 2 is laminated on the surface 1a of the semiconductor substrate 1. The xy plane including the x-axis and the y-axis is parallel to the surface 1a of the semiconductor substrate 1. The x-direction is a direction parallel to the center axis CL. The y-direction is orthogonal to the center axis CL.

As shown in FIG. 3, the insulating layer 2 includes a lower insulating layer 2a laminated on the semiconductor substrate 1, and an upper insulating layer 2b laminated on the lower insulating layer 2a. The primary winding conductor 20 includes plural primary-side lower linear conductors 21, 22, plural primary-side contact vias 26, and plural primary-side upper linear conductors 25. The plural primary-side lower linear conductors 21, 22 are provided between the lower insulating layer 2a and the upper insulating layer 2b. The plural primary-side lower linear conductors 21, 22 extend in parallel to the y-axis. The plural primary-side contact vias 26 penetrate through the upper insulating layer 2b at respective both end portions of the plural primary-side lower linear conductors 21, 22. The plural primary-side upper linear conductors 25 are provided on the upper insulating layer 2b, and connected to the plural primary-side contact vias 26. The plural primary-side upper linear conductors 25 contain primary-side upper linear conductors 25a, 25b1, 25b2 and 25d. The plural primary-side upper linear conductors 25 constitute a "three-dimensional quadrangle spiral shape" together with the plural primary-side lower linear conductors 21, 22 and the plural primary-side contact vias 26.

As shown in FIG. 3, the primary winding conductor 20 has the "three-dimensional quadrangle spiral shape" provided inside the insulating layer 2. The "three-dimensional quadrangle spiral shape" is a shape in which a linear object extends so as to bend in a rectangular shape while circling around the center axis CL when the spiral shape is viewed in parallel to the center axis CL of the spiral.

The three-dimensional quadrangle spiral shape of the primary winding conductor 20 will be described. First, inside the insulating layer 2, the primary-side contact via 26c which is one of the plural primary-side contact vias 26 extends in a downward direction so as to approach to the surface 1a of the semiconductor substrate 1. The "downward direction" is a direction opposite to the normal vector direction of the surface 1a of the semiconductor substrate 1, and corresponds to a minus z-axis direction. After the primary-side contact via 26c extends in the downward direction, the first primary-side lower linear conductor 21 connecting with this primary-side contact via 26c extends in a first plane direction. In this embodiment, the "first plane direction" corresponds to a minus y-direction. The "first plane direction" may be set to a direction parallel to the surface 1a of the semiconductor substrate 1, that is, any direction parallel to the xy plane.

After the first primary-side lower linear conductor 21 extends in the first plane direction, that is, the minus y-direction, the primary-side contact via 26a connecting with the first primary-side lower linear conductor 21 extends in an upward direction. The "upward direction" is opposite to the downward direction, that is, corresponds to the z-axis direction. The plural primary-side contact vias 26 extend in parallel to the z-axis, and have no structural difference from one another. The "downward direction" and the "upward direction" described here are expressions for convenience to describe the three-dimensional quadrangle spiral shape. After the primary-side contact via 26a extends in the upward direction, the primary-side upper linear conductor 25b1 connecting with the primary-side contact via 26a extends in a second plane direction. In this embodiment, the "second plane direction" is not parallel to the y-direction, but is a composite vector between the y-direction vector and the x-direction vector. Therefore, both the ends of the primary-side upper linear conductor 25b1 are displaced from each other in the x-direction. The "second plane direction" may be set to a direction parallel to the surface 1a of the semiconductor substrate 1, that is, any direction parallel to the xy plane.

The linearly processed conductor film extends while repetitively bending in the foregoing order, thereby obtaining the quadrangle spiral shape circling around the center axis CL. That is, the primary-side upper linear conductor 25b1, the primary-side contact via 26b, the second primary-side lower linear conductor 22 and the remaining primary-side contact via 26 and the primary-side upper linear conductor 25d are connected to one another, whereby the linear conductor extends to further make a round about the center axis CL.

The secondary winding conductor 30 includes plural secondary-side lower linear conductors 31, 32, plural secondary-side contact vias 36, and plural secondary-side upper linear conductors 35. The plural secondary-side lower linear conductors 31, 32 are provided between the lower insulating layer 2a and the upper insulating layer 2b. The plural secondary-side lower linear conductors 31, 32 extend in parallel to the y-axis. The plural secondary-side lower linear conductors 31, 32 are provided in the same layer as the plural primary-side lower linear conductors 21, 22. The plural secondary-side contact vias 36 penetrate through the upper insulating layer 2b at respective both end portions of the plural secondary-side lower linear conductors 31, 32. The plural secondary-side contact vias 36 are provided in the same layer as the plural primary-side contact vies 26. The plural secondary-side upper linear conductors 35 are provided on the upper insulating layer 2b, and connected to the plural secondary-side contact vias 36. The plural secondary-side upper linear conductors 35 contain secondary-side upper linear conductors 35a, 35b1, 35b2 and 35d. The plural secondary-side upper linear conductors 35 constitute a quadrangle spiral shape together with the plural secondary-side lower linear conductors 31, 32 and the plural secondary-side contact vias 36. The plural secondary-side upper linear conductors 35 are provided in the same layer as the plural primary-side upper linear conductors 25.

Like the primary winding conductor 20, the secondary winding conductor 30 has a three-dimensional quadrangle spiral shape provided inside the insulating layer 2. The three-dimensional quadrangle spiral shape of the secondary winding conductor 30 is provided in the insulating layer 2 while being spaced from the primary winding conductor 20 in plan view of the semiconductor substrate 1. Like the primary winding conductor 20, the secondary winding conductor 30 has a quadrangle spiral shape which repetitively extends in the following order of the "downward direction", the "first plane direction", the "upward direction" and the "second plane direction" described above.

Since the plural primary-side lower linear conductors 21, 22 and the plural secondary-side lower linear conductors 31, 32 are provided in the same layer, these conductors can be formed in a lump by the same wiring formation process. Since the plural primary-side upper linear conductors 25 and the plural secondary-side upper linear conductors 35 are provided in the same layer, these conductors can be formed in a lump by the same wiring formation process. The via formation processes for providing the primary-side contact vias 26 and the secondary-side contact vias 36 can be performed collectively.

The primary winding conductor 20 and the secondary winding conductor 30 are away from each other at only an interval $D_1$ in the xy plane direction. A desired withstand voltage can be easily obtained by adjusting the interval $D_1$ when the primary winding conductor 20 and the secondary winding conductor 30 are formed. The electrical insulation between the primary winding conductor 20 and the secondary winding conductor 30 can be easily ensured by providing the primary winding conductor 20 and the secondary winding conductor 30 in the insulating layer 2 so that both the conductors 20 and 30 are spaced from each other in the xy plane direction. As a result, since it is unnecessary to insulate the primary winding conductor 20 and the secondary winding conductor 30 from each other in the z-direction, it is unnecessary to provide an insulating film having a large thickness in the z-direction between the primary winding conductor 20 and the secondary winding conductor 30.

According to the horizontal micro-transformer 10 of the embodiment, each of the primary winding conductor 20 and the secondary winding conductor 30 has the quadrangle spiral shape. The winding conductor having the polygonal type spiral shape can be formed by connecting the "plural linear conductors" in parallel to the plane direction of the insulating layer 2, that is, the xy plane direction, and "plural contact vias" vertical to the insulating layer 2. The "quadrangle spiral shape" may be a "square spiral shape" or a "rectangular spiral shape". The "plural linear conductors" contain the primary-side lower linear conductors 21, 22, the primary-side upper linear conductors 25, the secondary-side lower linear conductors 31, 32 and the secondary-side upper linear conductors 35. The "plural contact vias" contain the plural primary-side contact vias 26 and the plural secondary-side contact vias 36. According to the structural feature as described above, the primary winding conductor 20 and the secondary winding conductor 30 can be formed by using the chemical vapor deposition method or the like as in the case of the wiring formation process. That is, the primary winding conductor 20 and the secondary winding conductor 30 can be formed by forming the conductor film according to the vacuum deposition method, the chemical vapor deposition method or sputtering as in the case of the wiring formation process applied to the semiconductor device 100. Since the horizontal micro-transformer 10 can be formed by diverting the wiring formation process for the semiconductor device 100, the manufacturing cost and the tact time for the horizontal micro-transformer 10 can be remarkedly reduced. Since the width W, winding numbers N1, N2 and the height in the z-direction of the primary winding conductor 20 and the secondary winding conductor 30 can be adjusted easily with high precision by patterning, transmission capacity of the level shift signal can be also adjusted.

The semiconductor device 100 is a gate driver for driving a power device, and includes a low potential side circuit 90 for driving an N-side power device, and a high potential side circuit 92 for driving a P-side power device. The N-side power device is a low potential side power device. The P-side power device is a high potential side power device. The low potential side circuit 90 drives the N-side power device with the ground set as a first reference potential GND. The high potential side circuit 92 drives the P-side power device with a second reference potential Vs higher than the first reference potential GND. The power device may be IGBT, MOSFET or a bipolar transistor. These power devices are used as semiconductor switching elements. In this embodiment, the second reference potential Vs is set as an example of a source potential. In order to protect the low potential side power device, the second reference potential Vs is required to be separated from the first reference potential GND. Furthermore, a level shift function is required to transmit, to the Vs potential, a signal input to the first reference potential GND. When the signal is transmitted from the Vs potential to the first reference potential GND, an inverse level shift function is also required. A photo-coupler, HVIC and a micro-transformer are known as a general level shift element for a gate driver. The micro-transformer has an advantage that it has higher temperature tolerance and higher resistance to deterioration, as compared with the photo-coupler. Furthermore, the micro-transformer has also an advantage that a leak current occurring in HVIC does not flow because it has an insulation separation structure. The horizontal micro-transformer 10 according to the present embodiment has these advantages of the micro-transformer.

Figure 4:
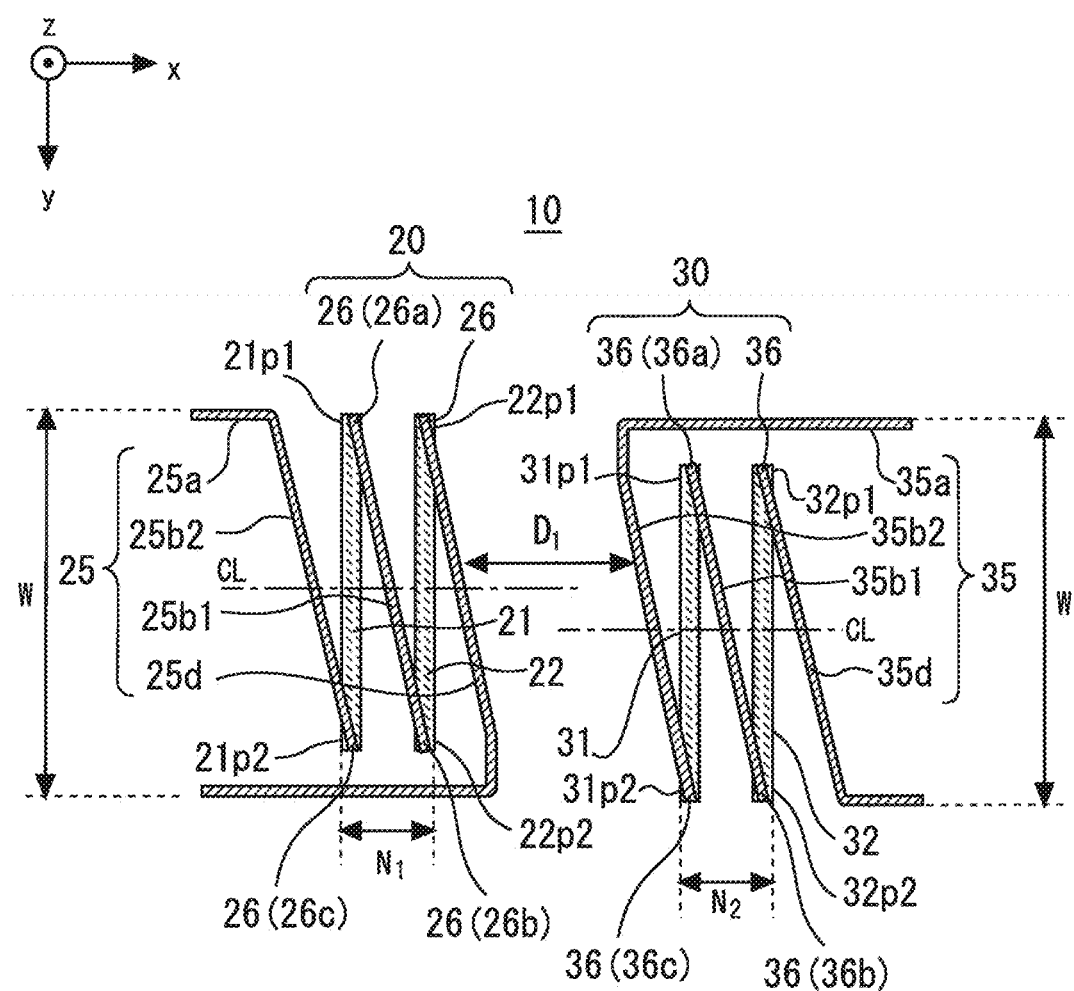
FIG. 4 is a plan view of a transformer according to the embodiment.

FIG. 4 is a plan view of the horizontal micro-transformer 10 according to the embodiment. It is assumed that the plural primary-side lower linear conductors 21, 22 and the plural secondary-side lower linear conductors 31, 32 have the same thickness and the same length. It is also assumed that the plural primary-side upper linear conductors 25 and the plural secondary-side upper linear conductors 35 have the same thickness and the same length.

In FIG. 4, for convenience of illustration, the plural primary-side upper linear conductors 25 located above the plural primary-side lower linear conductors 21, 22 are illustrated as being narrower than the plural primary-side lower linear conductors 21, 22. However, no limitation in thickness is set between each of the plural primary-side lower linear conductors 21, 22 and each of the plural primary-side upper linear conductors 25, and both the conductors may have the same thickness, or one conductor may be larger in thickness than the other conductors. In this point, the same is applied to the plural secondary-side lower linear conductors 31, 32 and the plural secondary-side upper linear conductors 35.

As is apparent from FIG. 4, the lengths of the plural primary-side lower linear conductors 21, 22 and the plural secondary-side lower linear conductors 31, 32 are the dimensions in the y-direction. The lengths of the plural primary-side lower linear conductors 21, 22 determine the width W of the primary winding conductor 20, and the lengths of the plural secondary-side lower linear conductors 31, 32 determine the width W of the secondary winding conductor 30. At least one of the winding number and the width may be different between the primary winding conductor 20 and the secondary winding conductor 30.

In the embodiment, each of the primary winding conductor 20 and the secondary winding conductor 30 is twice wound around the center axis CL. Accordingly, each of the winding number N1 of the primary winding conductor 20 and the winding number N2 of the secondary winding conductor 30 is equal to 2. The winding number may be increased by winding each of the primary winding conductor 20 and the secondary winding conductor 30 around the center axis CL at three or more times.

Figure 5:
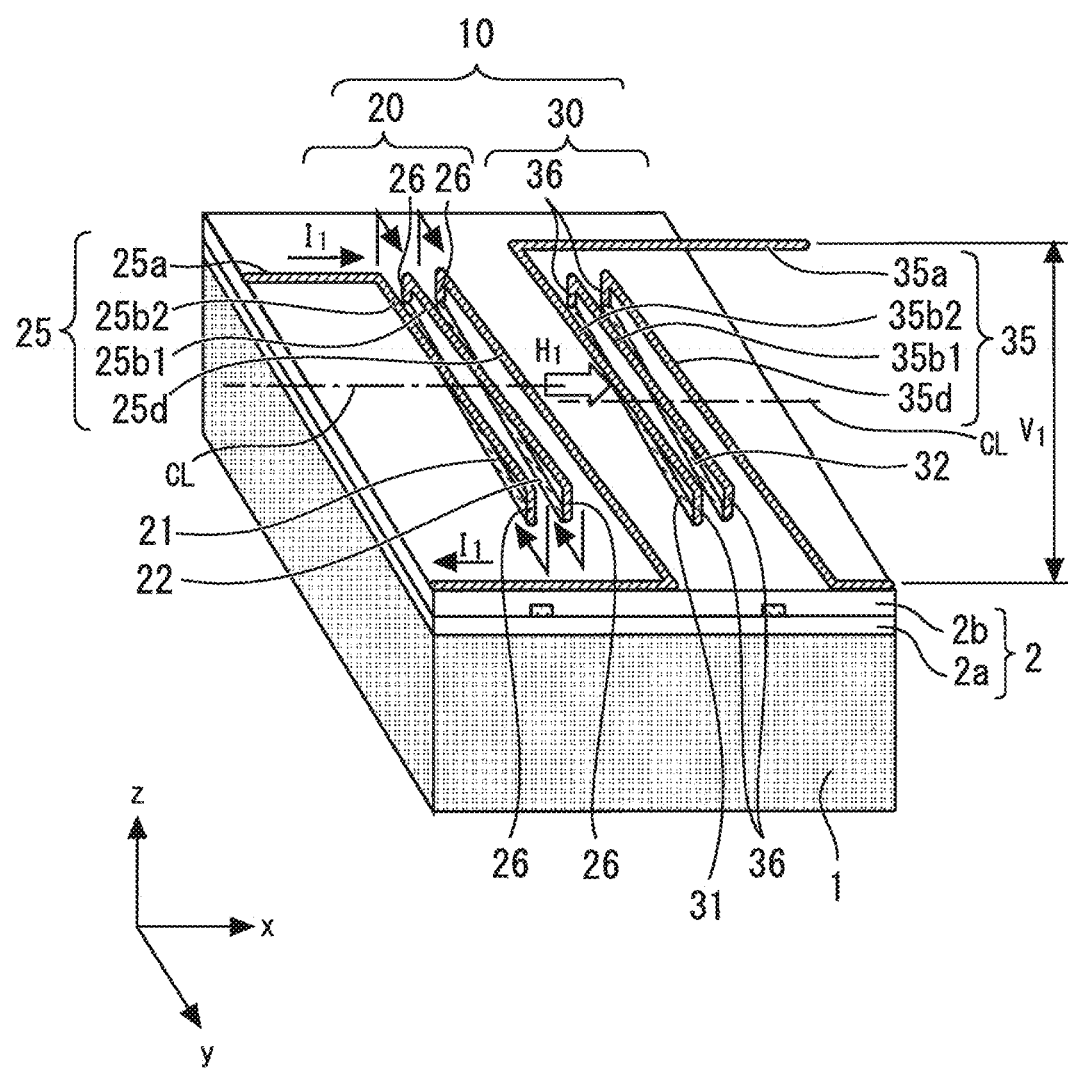
FIG. 5 is a diagram showing an action and an effect of a transformer according to the embodiment.

FIG. 5 is a diagram showing an action and an effect of the horizontal micro-transformer 10 according to the embodiment. When a primary current $I_1$ flows in the primary winding conductor 20 of the horizontal micro-transformer 10, magnetic field $H_1$ occurs due to the coil structure of the primary winding conductor 20. In the secondary winding conductor 30 of the horizontal micro-transformer 10, induced electromotive force $V_1$ occurs so as to offset the occurring magnetic field. This series of actions enables level shift transmission of signals. When no signal transmission is performed, the primary winding conductor 20 and the secondary winding conductor 30 are separated from each other at a predetermined separation distance $D_1$ in the horizontal direction with the insulating layer 2 being interposed therebetween. A required withstand voltage specification can be obtained by adjusting the predetermined separation distance. There is an advantage that electrical separation is possible without generating any leak current. As a result, it is possible in a gate drive circuit that mutual signal transmission can be performed between a low potential side and a high potential side of 600 V or the like with ensuring electrical separation between the low potential side and the high potential side.

Manufacturing Method of Embodiment

Figure 21:
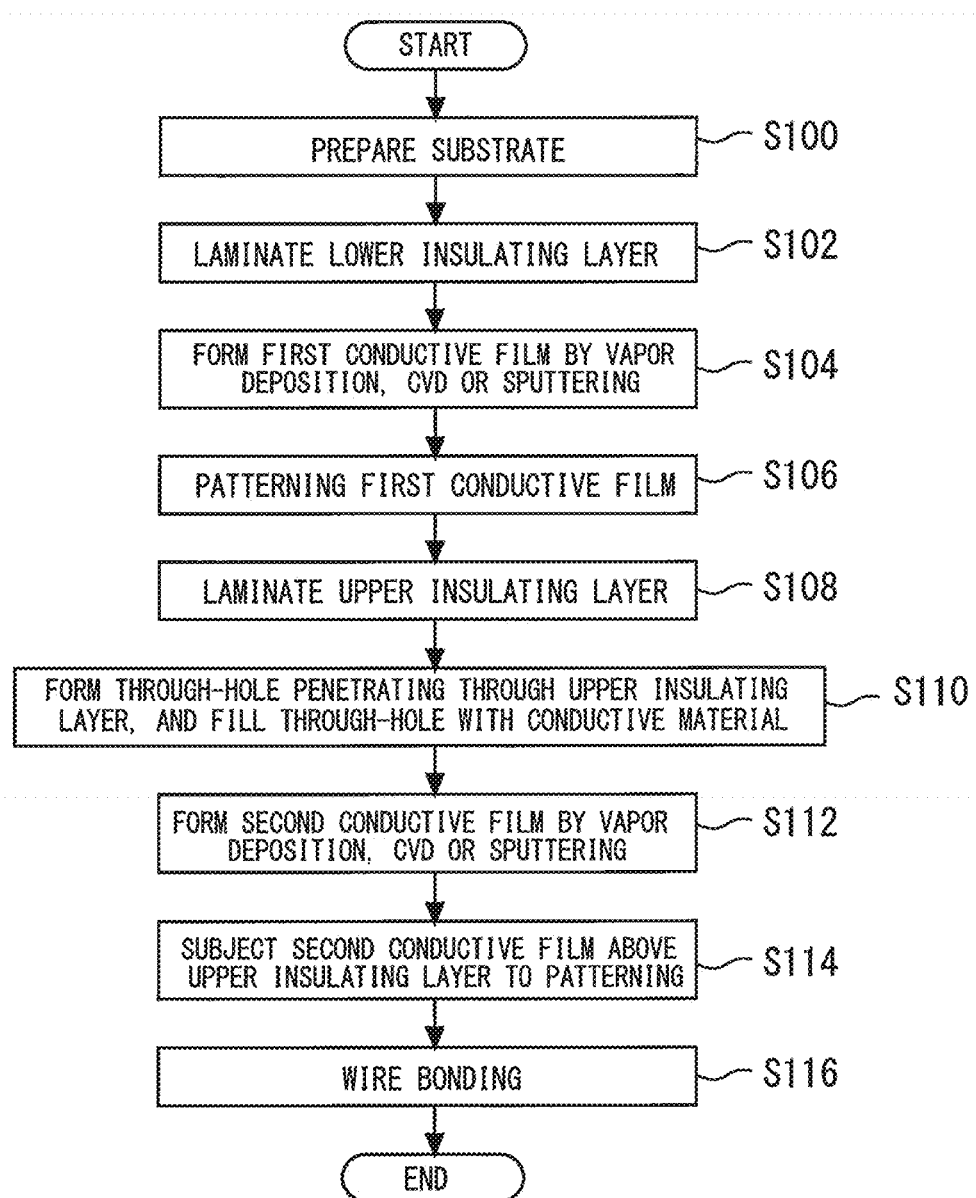
FIG. 21 is a flowchart showing a method of manufacturing a transformer and the semiconductor device according to the embodiment.

FIG. 21 is a flowchart showing a method of manufacturing the horizontal micro-transformer 10 and the semiconductor device 100 according to the embodiment. FIGS. 26 to 31 are manufacturing flow diagrams illustrating the method of manufacturing the horizontal micro-transformer 10 according to the embodiment.

Figure 26:
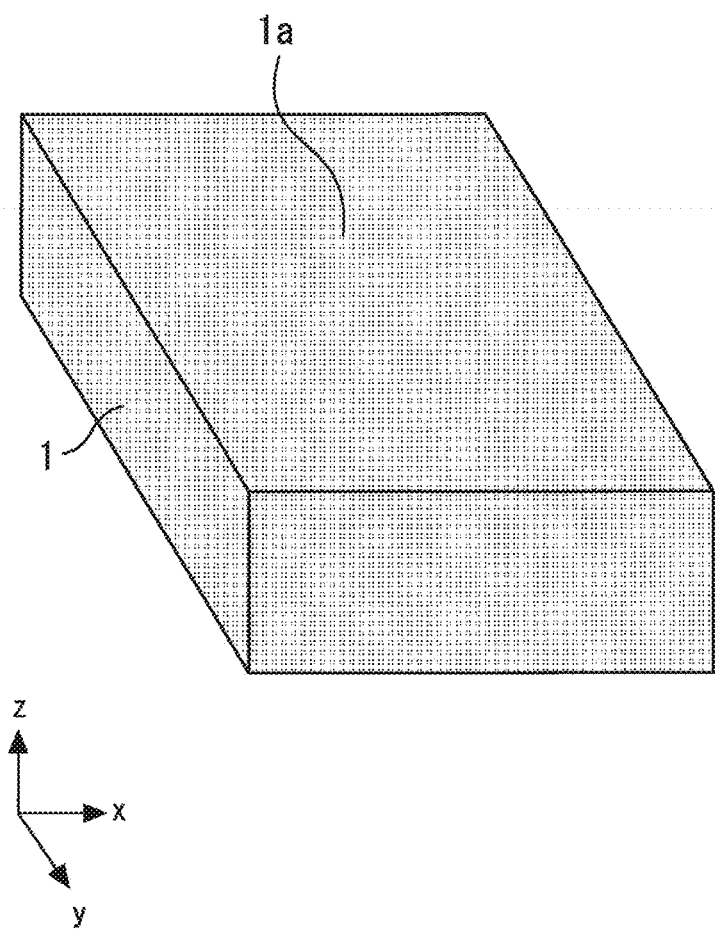
FIG. 26 is a manufacturing flow diagram illustrating the method of manufacturing a transformer according to the embodiment.
Figure 27:
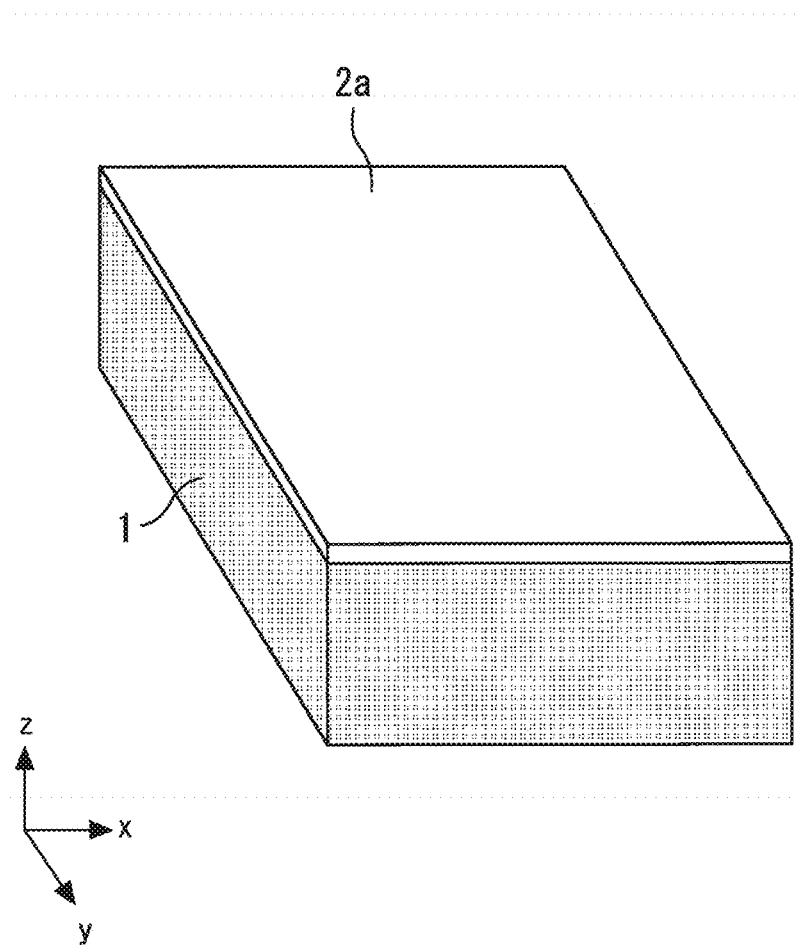
FIG. 27 is a manufacturing flow diagram illustrating the method of manufacturing a transformer according to the embodiment.

First, in step S100, a semiconductor substrate 1 is prepared. This step is shown in FIG. 26. Next, in step S102, a lower insulating layer 2a is laminated on the surface 1a of the semiconductor substrate 1. This step is shown in FIG. 27.

Next, in step S104, a first conductor film is laminated on the lower insulating layer 2a by the vacuum deposition method, the chemical vapor deposition method or the sputtering.

Next, in step S106, the first conductor film is subjected to patterning to form a first primary-side lower linear conductor 21 and a second primary-side lower linear conductor 22. In this step S106, the first conductor film is subjected to patterning to form a first secondary-side lower linear conductor 31 and a second secondary-side lower linear conductor 32 too. The first primary-side lower linear conductor 21, the second primary-side lower linear conductor 22, the first secondary-side lower linear conductor 31 and the second secondary-side lower linear conductor 32 are arranged side by side while being spaced away from each other in plan view of the semiconductor substrate 1.

Figure 28:
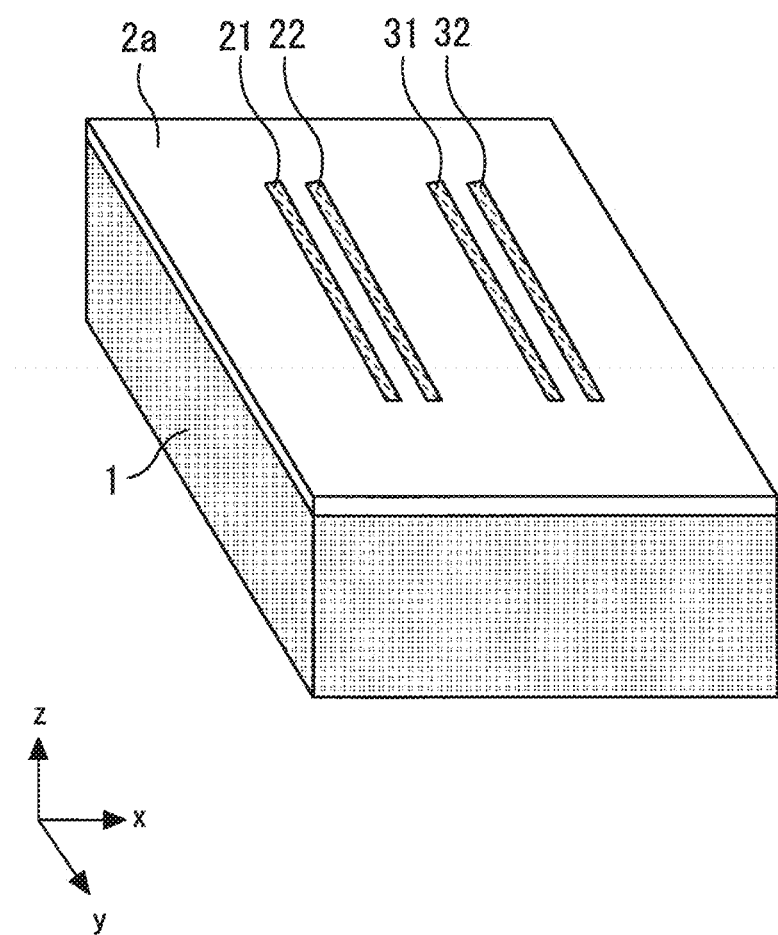
FIG. 28 is a manufacturing flow diagram illustrating the method of manufacturing a transformer according to the embodiment.

The stage where the steps S104 and S106 have been just finished is shown in FIG. 28.

Figure 29:
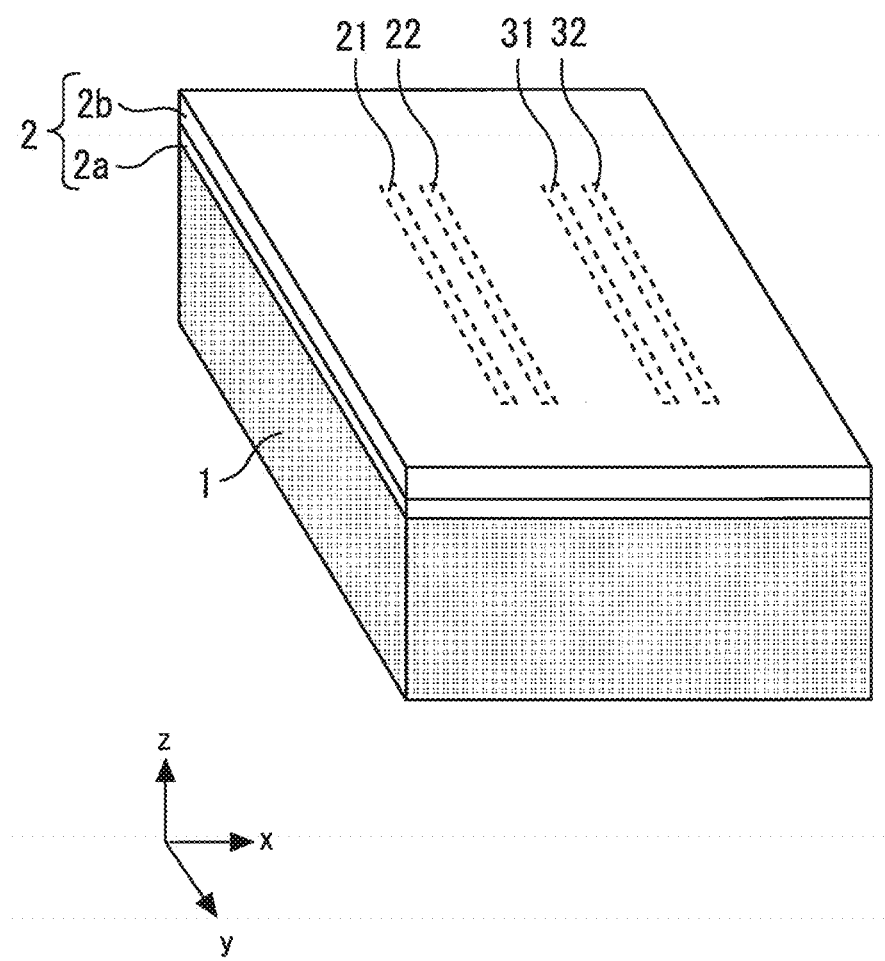
FIG. 29 is a manufacturing flow diagram illustrating the method of manufacturing a transformer according to the embodiment.

Next, in step S108, an upper insulating layer 2b is laminated on the lower insulating layer 2a in which the first primary-side lower linear conductor 21, the second primary-side lower linear conductor 22, the first secondary-side lower linear conductor 31 and the second secondary-side lower linear conductor 32 are formed. This step is shown in FIG. 29.

Figure 30:
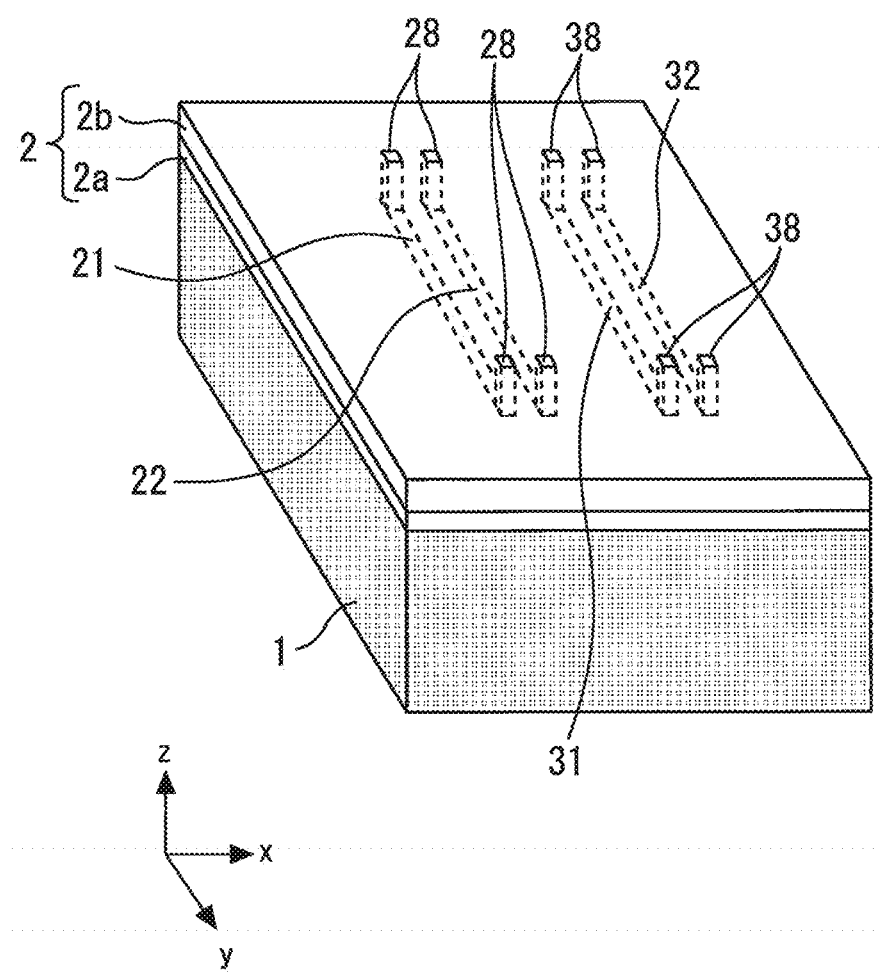
FIG. 30 is a manufacturing flow diagram illustrating the method of manufacturing a transformer according to the embodiment.

Next, in step S110, plural primary-side contact vias 26 penetrating through the upper insulating layer 2b are provided so as to reach one end and the other end of the first primary-side lower linear conductor 21 and one end and the other end of the second primary-side lower linear conductor 22. In this step S110, plural secondary-side contact vias 36 penetrating through the upper insulating layer 2b are also provided so as to reach one end and the other end of the first secondary-side lower linear conductor 31 and one end and the other end of the second secondary-side lower linear conductor 32. Specifically, plural grooves 28, 38 are formed, by dry etching, at positions where plural primary-side contact vias 26 and plural secondary-side contact vias 36 will be provided. The stage where the plural grooves 28, 38 have been provided is shown in FIG. 30. The plural grooves 28, 38 are filled with a conductive material to form contact vias.

Next, in step S112, a second conductor film is laminated on the upper insulating layer 2b by the vacuum deposition method, the chemical vapor deposition method or the sputtering.

Next, in step S114, the second conductor film is subjected to patterning to form plural primary-side upper linear conductors 25 containing a first primary-side upper linear conductor 25b1 and a second primary-side upper linear conductor 25b2. End portions of each of the first primary-side upper linear conductor 25b1 and the second primary-side upper linear conductor 25b2 connect with the primary-side contact vias 26. In this step S114, the second conductor film is subjected to patterning to form plural secondary-side upper linear conductors 35 containing a first secondary-side upper linear conductor 35b1 and a second secondary-side upper linear conductor 35b2 too. End portions of each of the first secondary-side upper linear conductor 35b1 and the second secondary-side upper linear conductor 356b2 connect with the secondary-side contact vias 36.

Figure 31:
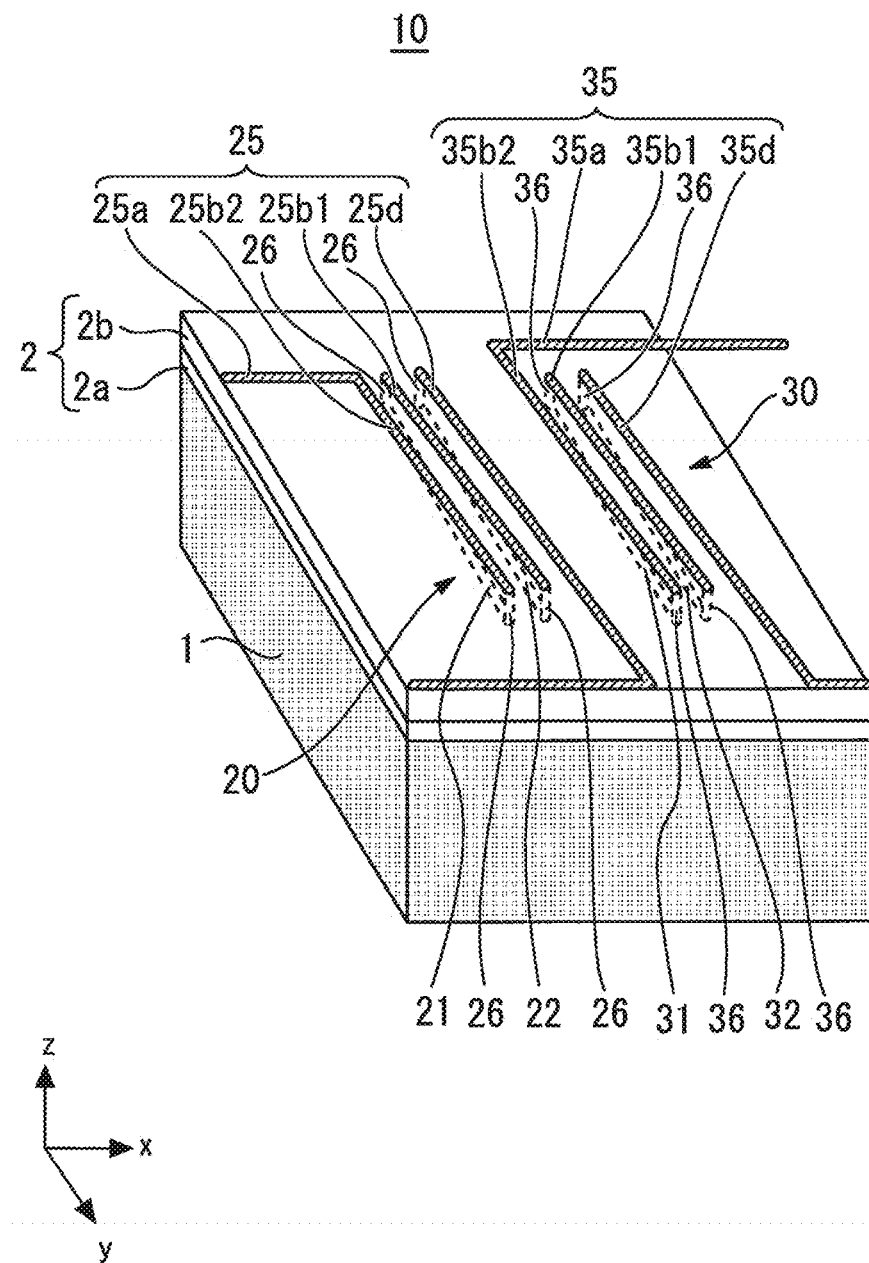
FIG. 31 is a manufacturing flow diagram illustrating the method of manufacturing a transformer according to the embodiment.

The stage where the steps S112 and S114 have been finished is shown in FIG. 31.

Here, a structure in plan view will be described with reference to FIG. 4. In the foregoing step S114, the first primary-side upper linear conductor 25b1 is formed so as to connect one primary-side contact via 26a and another primary-side contact via 26b to each other. The one primary-side contact via 26a is positioned at a first end portion of the first primary-side lower linear conductor 21. The other primary-side contact via 26b is positioned at one of one end and the other end of the second primary-side lower linear conductor 22 which is located on a farther side of the second primary-side lower linear conductor 22 from the first end portion of the first primary-side lower linear conductor 21. Yet another primary-side contact via 26c is positioned at a second end portion of the first primary-side lower linear conductor 21. In step S114, the second primary-side upper linear conductor 25b2 is formed so as to connect with the yet another primary-side contact via 26c. Accordingly, the first primary-side lower linear conductor 21, the second primary-side lower linear conductor 22, the first primary-side upper linear conductor 25b1 and the second primary-side upper linear conductor 25b2 can be connected to one another via the plural primary-side contact vias 26a, 26b and 26c. As a result, the primary winding conductor 20 is formed so as to have a quadrangle spiral shape having the center axis CL. The center axis CL extends in the xy plane direction parallel to the surface 1a of the semiconductor substrate 1.

In the foregoing step S114, the first secondary-side upper linear conductor 35b1 is formed so as to connect one secondary-side contact via 36a and another secondary-side contact via 36b to each other. The one secondary-side contact via 36a is positioned at a first end portion of the first secondary-side lower linear conductor 31. The other secondary-side contact via 36b is positioned at one of one end and the other end of the second secondary-side lower linear conductor 32 which is located on a farther side of the second secondary-side lower linear conductor 32 from the first end portion of the first secondary-side lower linear conductor 31. Yet another secondary-side contact via 36c is positioned at a second end portion of the first secondary-side lower linear conductor 31. In step S114, the second secondary-side upper linear conductor 35b2 is formed so as to connect with the yet another secondary-side contact via 36c. Accordingly, the first secondary-side lower linear conductor 31, the second secondary-side lower linear conductor 32, the first secondary-side upper linear conductor 35b1 and the second secondary-side upper linear conductor 35b2 can be connected to one another via the plural secondary-side contact vias 36a, 36b and 36c. As a result, the secondary winding conductor 30 is formed so as to have a quadrangle spiral shape having the center axis CL.

According to the foregoing manufacturing method, the primary winding conductor 20 and the secondary winding conductor 30 are provided side by side so as to be spaced from each other in the plane direction of the insulating layer 2, whereby the horizontal micro-transformer 10 can be manufactured.

The structure of in FIG. 4 may be described as follows. As described in FIG. 4, the contact vias 26 reach "a first end 21p1" and "a second end 21p2" of the first primary-side lower linear conductor 21 and "a third end 22p1" and "a fourth end 22p2" of the second primary-side lower linear conductor 22. The first end 21p1 is adjacent to the third end 22p1. The second end 21p2 is adjacent to the fourth end 22p2. The first primary-side upper linear conductor 25b1 is formed so as to connect a first contact via (i.e. the one primary-side contact via 26a) positioned at the first end 21p1 of the first primary-side upper linear conductor 21 to a second contact via (i.e. the other primary-side contact via 26b) positioned at the fourth end 22p2 of the second primary-side lower linear conductor 22. The second primary-side upper linear conductor 25b2 is formed so as to connect with a third contact via (i.e. the yet another primary-side contact via 26c) which is positioned at the second end 21p2 of the first primary-side lower linear conductor 21.

The structure in FIG. 4 may be described as follows. As described in FIG. 4, the contact vias 36 reach "a first end 31p1" and "a second end 31p2" of the first secondary-side lower linear conductor 31 and "a third end 32p1" and "a fourth end 32p2" of the second secondary-side lower linear conductor 32. The first end 31p1 is adjacent to the third end 32p1. The second end 31p2 is adjacent to the fourth end 32p2. The first secondary-side upper linear conductor 35b1 is formed so as to connect a first contact via (i.e. the one secondary-side contact via 36a) positioned at the first end 31p1 of the first secondary-side lower linear conductor 31 to a second contact via (i.e. the other secondary-side contact via 36b) positioned at the fourth end 32p2 of the second secondary-side lower linear conductor 32. The second secondary-side upper linear conductor 35b2 is formed so as to connect with a third contact via (i.e. the yet another secondary-side contact via 36c) which is positioned at the second end 31p2 of the first secondary-side lower linear conductor 31.

Next, in step S116, the horizontal micro-transformer 10 is connected to the low potential side circuit 90 and the high potential side circuit 92 via wires 4 by wire bonding. The semiconductor device 100 can be manufactured by the foregoing steps.

As described above, according to the horizontal micro-transformer 10 of the embodiment, each of the primary winding conductor 20 and the secondary winding conductor 30 has the quadrangle spiral shape. According to the structural feature as described above, the primary winding conductor 20 and the secondary winding conductor 30 can be formed by forming the conductor film according to the chemical vapor deposition method or the like as in the case of the wiring formation process. Therefore, the manufacturing efficiency of the horizontal micro-transformer 10 can be enhanced.

According to the horizontal micro-transformer 10 of the embodiment, the primary winding conductor 20 and the secondary winding conductor 30 are provided in the insulating layer 2 so as to be away from each other in the xy plane direction, whereby the electrical insulation between both the conductors 20 and 30 can be ensured. As a result, it is unnecessary to provide a thick insulating film required when the primary winding conductor 20 and the secondary winding conductor 30 are insulated from each other in the z-direction. Furthermore, a desired withstand voltage can be easily obtained by adjusting the positions of the primary winding conductor 20 and the secondary winding conductor 30 in the insulating layer 2.

According to the manufacturing method of the embodiment, as described in the steps S102 to S114, the conductor film is laminated by the vacuum deposition method, the chemical vapor deposition method or the sputtering, and the conductor film is subjected to patterning to form the plural linear conductors. Since this series of steps is the same as the wiring formation process applied to the semiconductor device 100, the primary winding conductor 20 and the secondary winding conductor 30 can be formed by diverting the wiring formation process of the semiconductor device 100. The plural winding conductors are formed side by side so as to be spaced from one another in the xy plane direction of the insulating layer 2, whereby the horizontal micro-transformer 10 can be obtained. As a result, the manufacturing cost and the tact time of the horizontal micro-transformer 10 can be remarkedly reduced.

Modification of Embodiment

[First Modification]

FIGS. 6 to 12 are plan views showing a horizontal micro-transformer 10 according to a modification of the embodiment. The horizontal micro-transformer 10 according to the first modification can be formed in various shapes in plan view as shown in FIGS. 6 to 12. In plan view, the structures shown in FIGS. 6 to 12 are different from that shown in FIG. 4, but the structures shown in FIGS. 6 to 12 are structures which have "three-dimensional quadrangle spiral shapes" and in which linear conductors extend while bending and circling around the center axis CL as in the case of FIG. 4.

Figure 6:
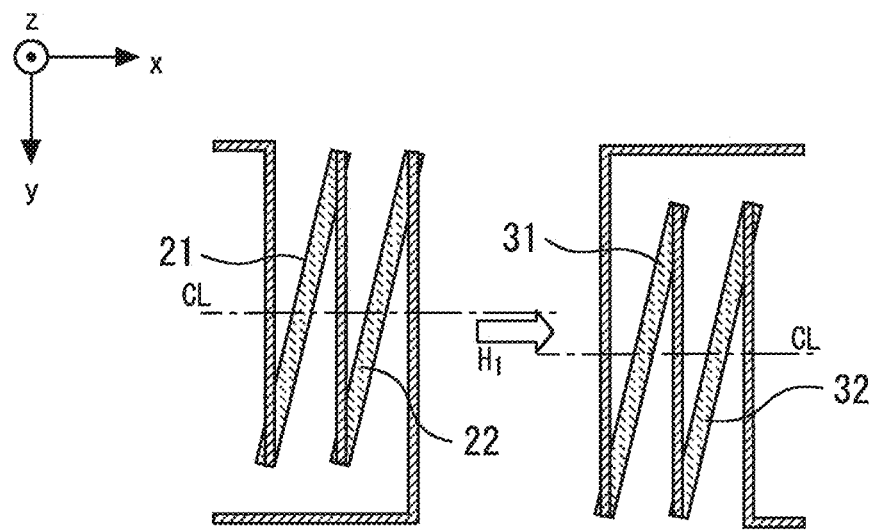
FIG. 6 is a plan view showing a transformer according to a modification of the embodiment.

As shown in FIG. 6, the plural primary-side lower linear conductors 21, 22 and the plural secondary-side lower linear conductors 31, 32 may be inclined with respect to the center axis CL. In FIG. 4, the plural primary-side lower linear conductors 21, 22 and the plural secondary-side lower linear conductors 31, 32 vertically intersect with the center axis CL, and in this point the structure of FIG. 4 and the structure of FIG. 6 are different from each other.

Figure 7:
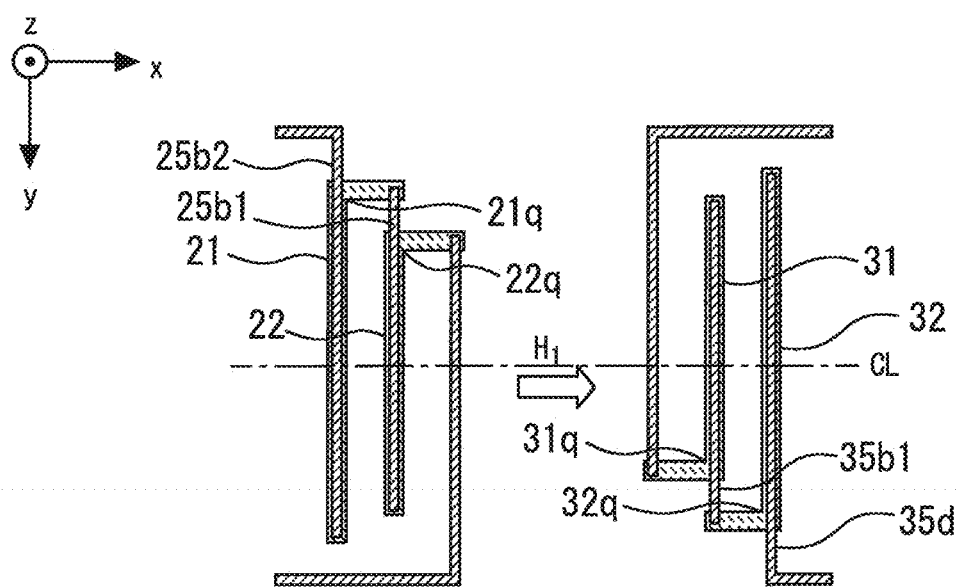
FIG. 7 is a plan view showing a transformer according to a modification of the embodiment.

As shown in FIG. 7, the plural primary-side lower linear conductors 21, 22 and the plural secondary-side lower linear conductors 31, 32 may have bent portions 21q, 22q, 31 q, 32q which are hooked, that is, bent in L-shape. The first primary-side lower linear conductor 21 and the primary-side upper linear conductor 25b extend in parallel to the y-direction while overlapping each other in plan view of the semiconductor substrate 1. One end of the first primary-side lower linear conductor 21 bends and extends in the x-direction. In plan view of FIG. 7, the primary-side upper linear conductor 25b1 extends linearly between one end of the first primary-side lower linear conductor 21 and one end portion of the second primary-side lower linear conductor 22. The primary-side upper linear conductor 25b1 and the second primary-side lower linear conductor 22 extend in parallel to the y-direction while overlapping each other in plan view of the semiconductor substrate 1. As described above, according to the modification of FIG. 7, there can be made portions at which the plural primary-side lower linear conductors 21, 22 and the plural primary-side upper linear conductors 25 extend in parallel to the y-direction while overlapping each other in plan view of the semiconductor substrate 1. The same is applied to the plural secondary-side lower linear conductors 31, 32 and the plural secondary-side upper linear conductors 35.

Figure 8:
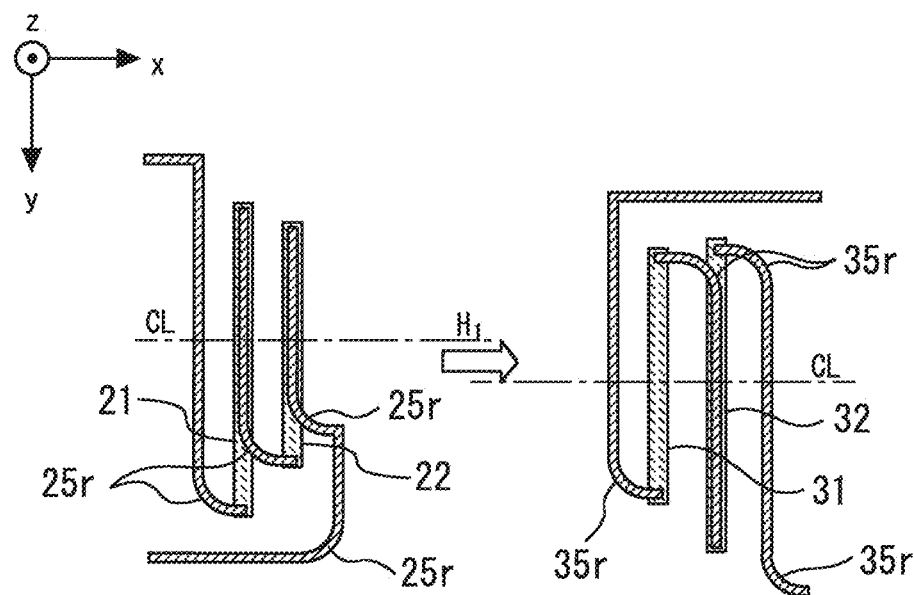
FIG. 8 is a plan view showing a transformer according to a modification of the embodiment.
Figure 9:
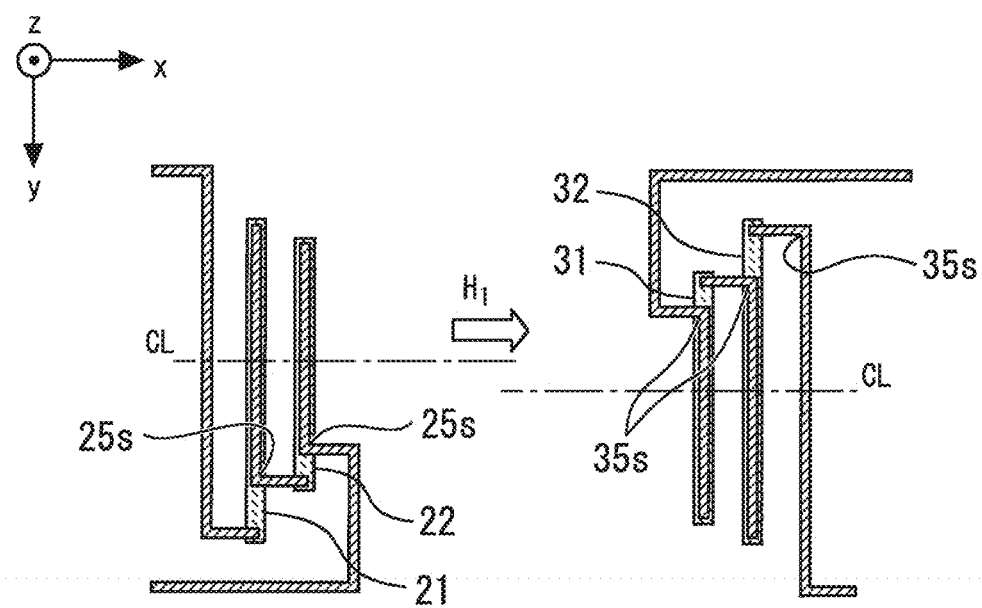
FIG. 9 is a plan view showing a transformer according to a modification of the embodiment.

As shown in FIGS. 8 and 9, the second primary-side lower linear conductor 22 may be formed to be shorter than the first primary-side lower linear conductor 21. In FIGS. 8 and 9, the plural primary-side lower linear conductors 21, 22 and the primary-side upper linear conductors 25 extend in parallel to each other while overlapping each other in plan view of the semiconductor substrate 1. Furthermore, the primary-side upper linear conductor 25 bends from the middle of the first primary-side lower linear conductor 21. The bent primary-side upper linear conductor 25 connects with the primary-side contact via 26 positioned at an end portion of the second primary-side lower linear conductor 22. The same is applied to the plural secondary-side lower linear conductors 31, 32 and the plural secondary-side upper linear conductors 35.

The difference between FIG. 8 and FIG. 9 resides in the bent shapes of the plural primary-side upper linear conductors 25 and the secondary-side upper linear conductors 35. In FIG. 8, the plural primary-side upper linear conductors 25 and the plural secondary-side upper linear conductors 35 are bent at rounded curved portions 25r, 35r. In FIG. 9, the plural primary-side upper linear conductors 25 and the plural secondary-side upper linear conductors 35 are bent at right-angled crooked portions 25s, 35s.

Figure 10:
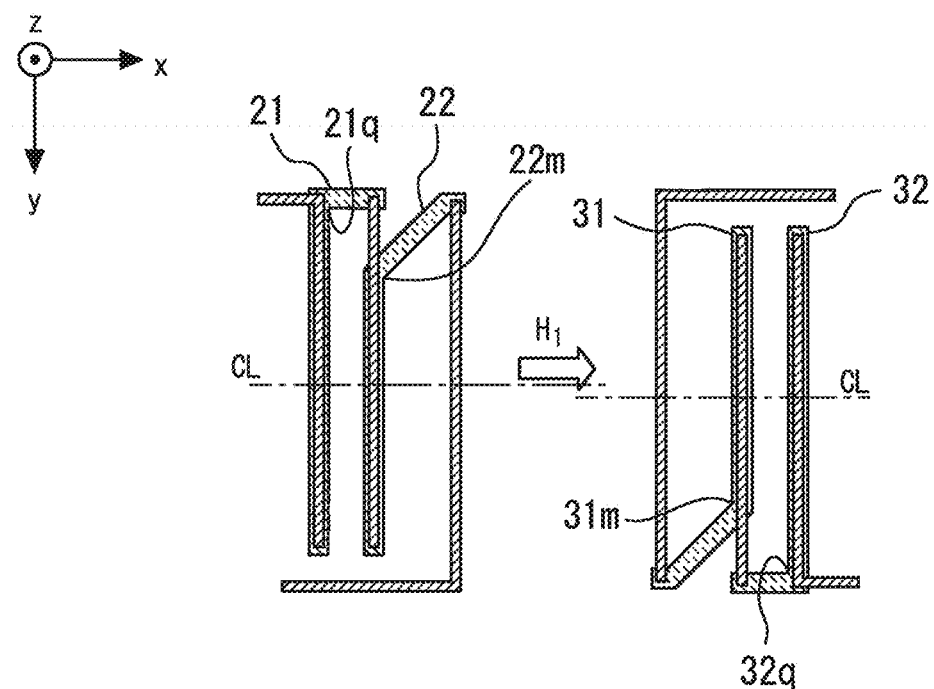
FIG. 10 is a plan view showing a transformer according to a modification of the embodiment.
Figure 11:
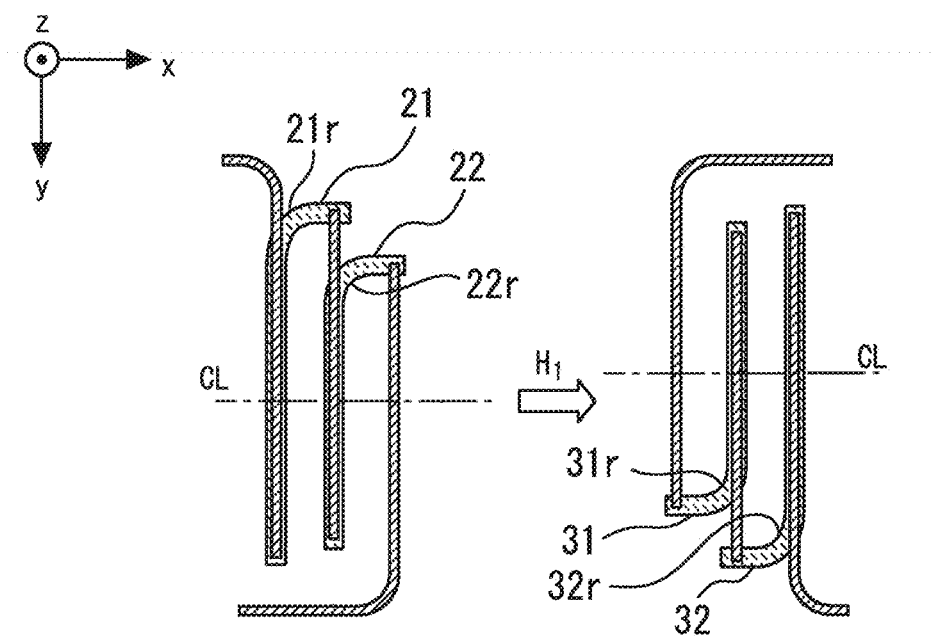
FIG. 11 is a plan view showing a transformer according to a modification of the embodiment.

As shown in FIG. 10, the bent portions 22q, 31q in FIG. 7 may be modified to obliquely bent portions 22m, 31m which are obliquely bent. As shown in FIG. 11, the bent portions 21q, 22q, 31q, 32q in the modification of FIG. 7 may be modified to rounded curved portions 21r, 22r, 31r, 32r.

Figure 12:
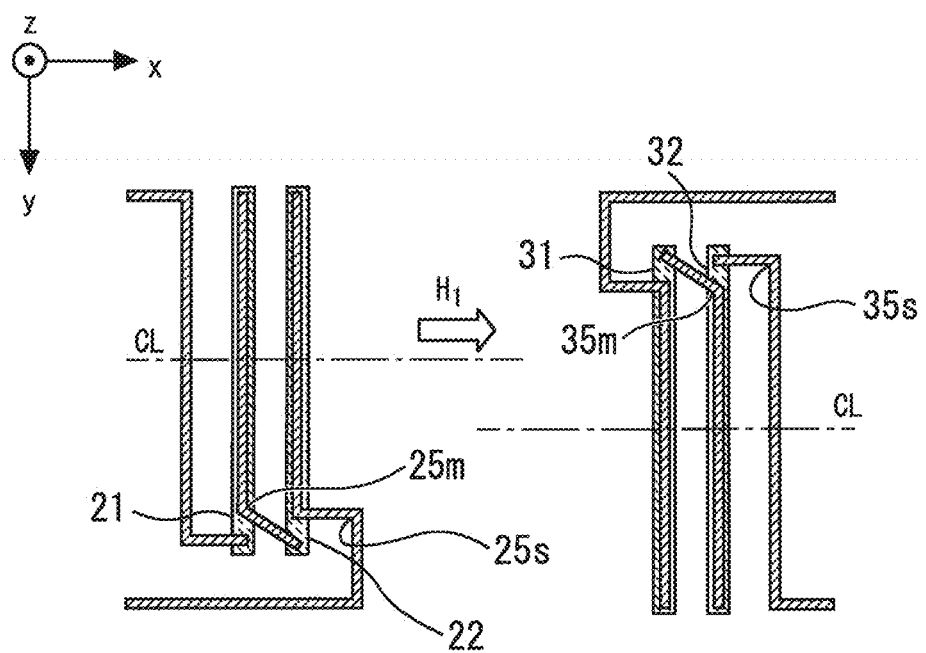
FIG. 12 is a plan view showing a transformer according to a modification of the embodiment.

As shown in FIG. 12, parts of the crooked portions 25s, 35s in FIG. 9 may be modified to obliquely bent portions 25m, 35m which are obliquely bent.

[Second Modification]

Figure 13:
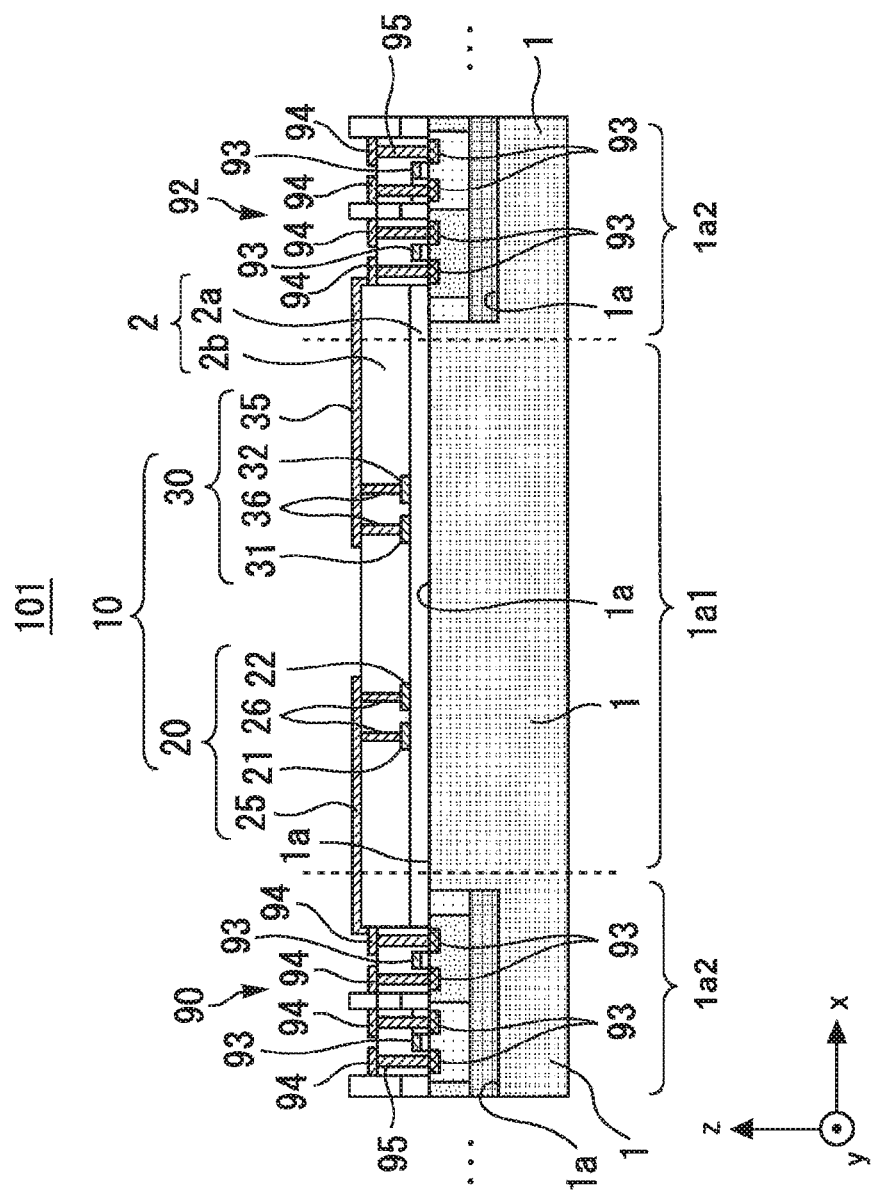
FIG. 13 is a diagram showing a semiconductor device according to a modification of the embodiment.

FIG. 13 is a diagram showing a semiconductor device 101 according to a modification of the embodiment. The semiconductor device 101 includes a semiconductor substrate 1, an insulating layer 2 laminated on a first part 1a1 of the surface 1a of the semiconductor substrate 1, a horizontal micro-transformer 10 formed on the insulating layer 2, and a low potential side circuit 90 and a high potential side circuit 92 which are provided on a second part 1a2 of the surface 1a of the semiconductor substrate 1. As shown in FIG. 13, the "first part" 1a1 is a center region on the surface 1a of the semiconductor substrate 1, and the "second part" 1a2 is regions at both the sides of the first part on the surface 1a of the semiconductor substrate 1. The low potential side circuit 90 includes lower layer wirings 93, wiring vias 95 and upper layer wirings 94 which are provided on the second part 1a2 of the surface 1a of the semiconductor substrate 1. The high potential side circuit 92 includes lower layer wirings 93, wiring vias 95 and upper layer wirings 94 which are provided on the second part 1a2 of the surface 1a of the semiconductor substrate 1. The semiconductor device 101 according to the second modification is different from the semiconductor device 100 according to the embodiment in that the horizontal micro-transformer 10 is integrated together with the low potential side circuit 90 and the high potential side circuit 92 on one semiconductor substrate 1.

In the modification of FIG. 13, all of the lower layer wirings 93, the wiring vias 95, the upper layer wirings 94, the primary winding conductor 20 and the secondary winding conductor 30 are configured by a conductor film selected from the group consisting of a vacuum deposition film, a chemical vapor deposition film and sputtered film. In steps S104 and S106, the lower layer wirings 93 of the low potential side circuit 90 and the high potential side circuit 92 may be formed together with the plural primary-side lower linear conductors 21, 22 and the plural secondary-side lower linear conductors 31, 32. In steps S112 and S114, the upper layer wirings 94 of the low potential side circuit 90 and the high potential side circuit 92 may be formed together with the plural primary-side upper linear conductors 25 and the plural secondary-side upper linear conductors 35. As a result, there is an advantage that the lower layer wirings 93, the wiring vias 95, the upper layer wirings 94, the primary winding conductor 20 and the secondary winding conductor 30 can be formed by a common wiring formation process.

The foregoing first modification may be applied to the horizontal micro-transformer integration type semiconductor device 101 according to the foregoing second modification.

[Third Modification]

Figure 14:
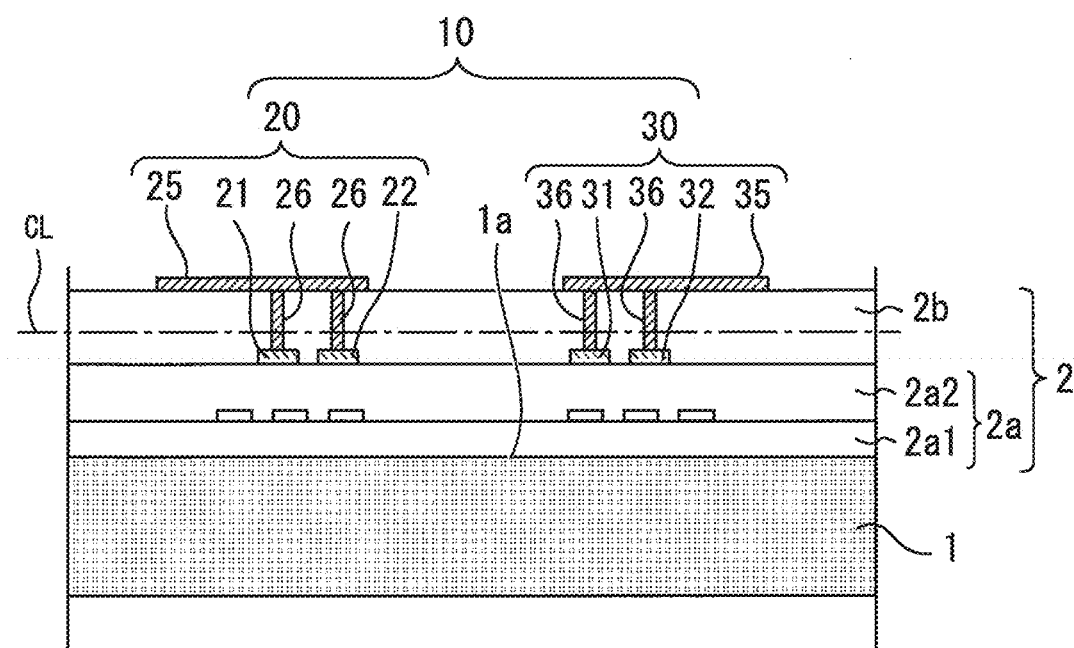
FIG. 14 is an enlarged cross-sectional view of a transformer according to a modification of the embodiment.

FIG. 14 is an enlarged cross-sectional view of a horizontal micro-transformer 10 according to a modification of the embodiment. A semiconductor device 101a according to the modification shown in FIG. 14 has a three-layer wiring structure containing three insulating layers on the surface 1a of the semiconductor substrate 1. The primary winding conductor 20 and the secondary winding conductor 30 are formed in a second lower insulating layer 2a2 and the upper insulating layer 2b. That is, a first lower insulating layer 2a1 and the second lower insulating layer 2a2, which are two insulating layers located at the lower side, correspond to one lump lower insulating layer 2a.

Figure 15:
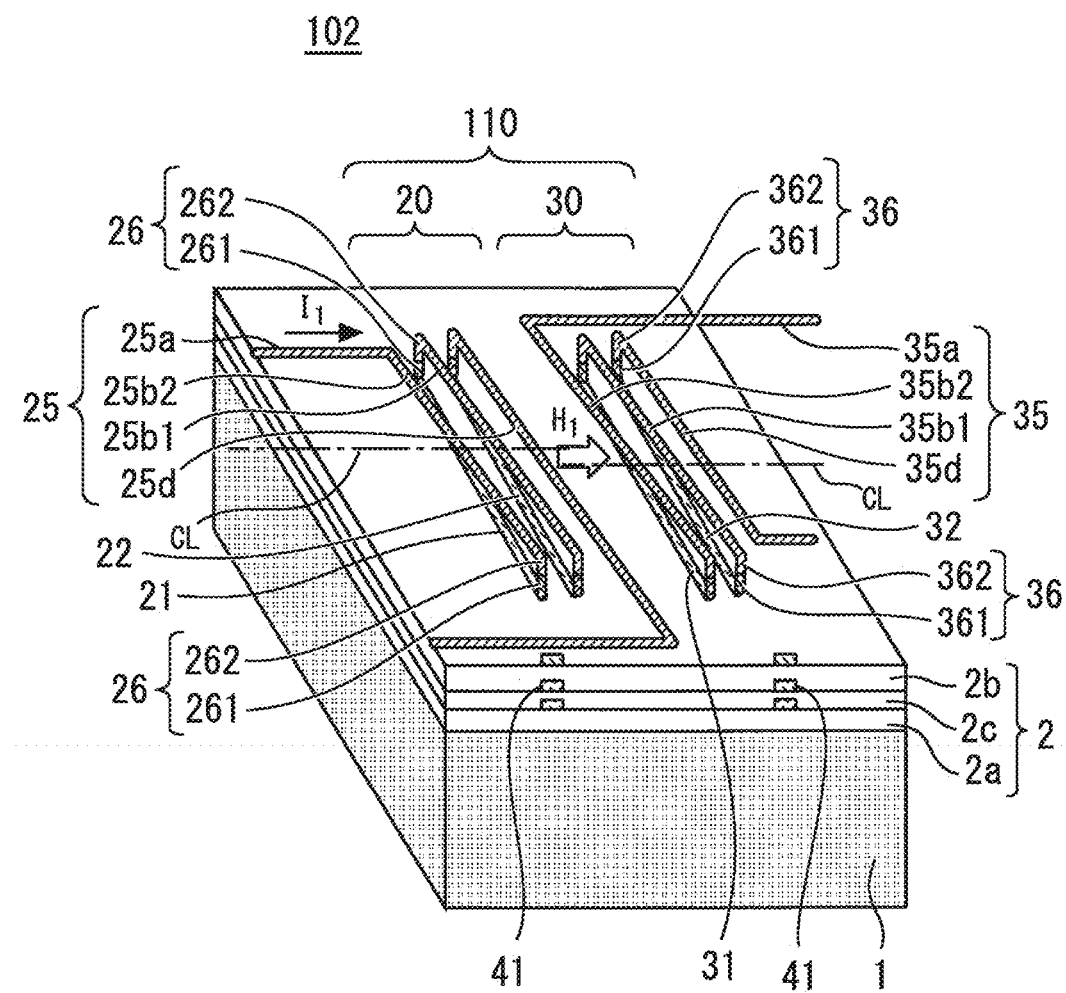
FIG. 15 is a perspective view showing a transformer according to a modification of the embodiment.

FIG. 15 is a perspective view showing the horizontal micro-transformer 110 according to a modification of the embodiment. According to the modification shown in FIG. 15, an intermediate insulating layer 2c is added between the lower insulating layer 2a and the upper insulating layer 2b. One primary-side lower contact via 261 provided in the intermediate insulating layer 2c is connected to one primary-side upper contact via 262 provided in the upper insulating layer 2b to form one primary-side contact via 26. Likewise, one secondary-side lower contact via 361 provided in the intermediate insulating layer 2c is connected to one secondary-side upper contact via 362 provided in the upper insulating layer 2b to form one secondary-side contact via 36.

Figure 22:
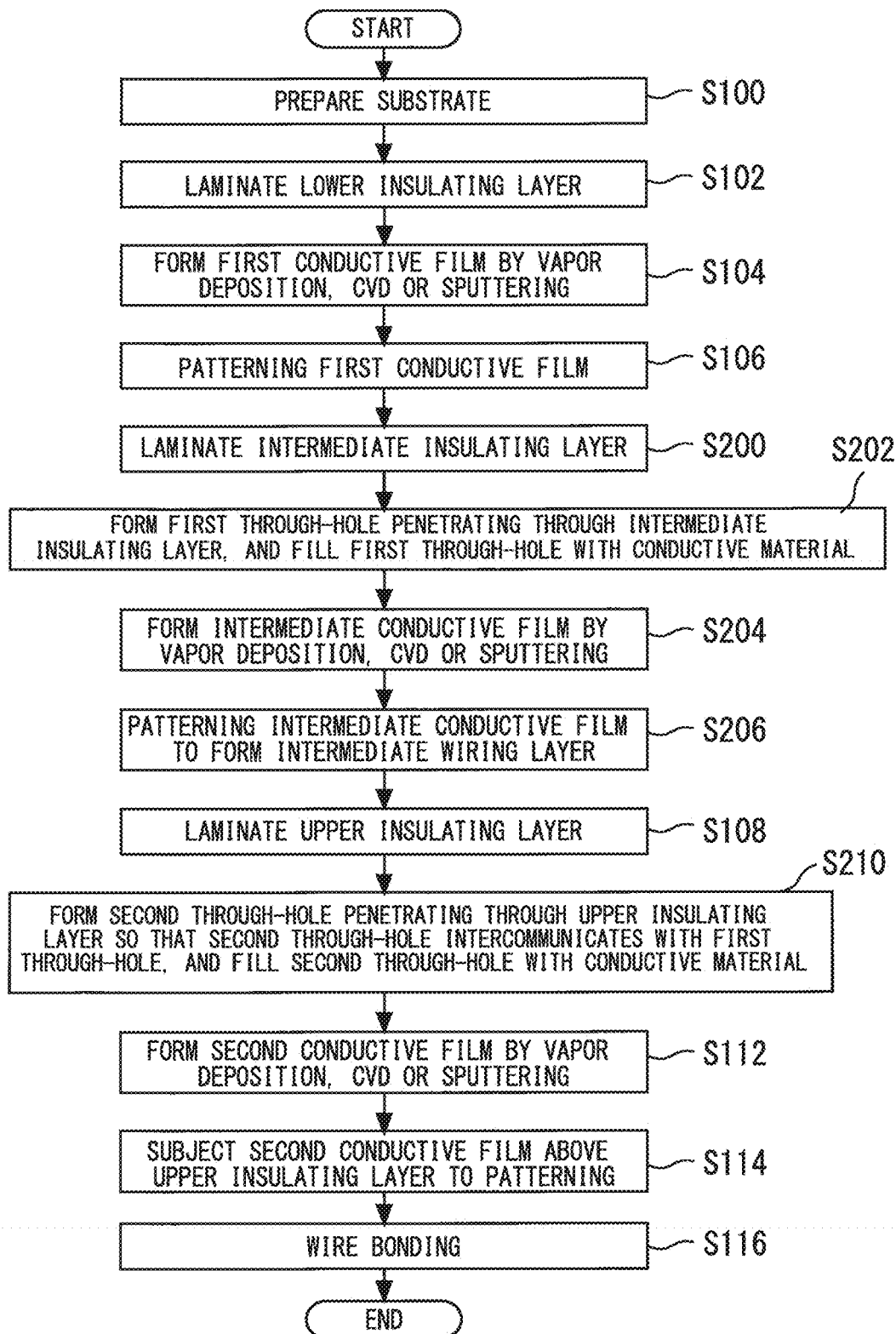
FIG. 22 is a flowchart showing a method of manufacturing a transformer and the semiconductor device according to the modification of the embodiment.

FIG. 22 is a flowchart showing a method of manufacturing the horizontal micro-transformer 110 and the semiconductor device 102 according to the modification of the embodiment. The difference between the flowchart of FIG. 22 and the flowchart of FIG. 21 resides in that the step S110 is omitted and also steps S200, S202, S204, S206 and S210 are added.

In the flowchart of FIG. 22, after step S106, the intermediate insulating layer 2c is laminated in step S200. In step S202, a first through-hole penetrating through the intermediate insulating layer 2c is provided, thereby forming the primary-side lower contact via 261 and the secondary-side lower contact via 361. Next, an intermediate conductive film is formed by CVD or the like in step S204. Next, in step S206, the intermediate conductive film is subjected to patterning to form an intermediate wiring layer 41. Next, step S108 is executed so that the upper insulating layer 2b is laminated so as to cover the intermediate wiring layer 41. Next, step S210 is executed. In step S210, a second through-hole penetrating through the upper insulating layer 2b is provided so as to intercommunicate with the first through-hole provided in step S202. In step S210, the second through-hole is filled with a conductor, thereby forming a primary-side upper contact via 262 and a secondary-side upper contact via 362. Thereafter, steps S112, S114 and S116 are executed as in the case of the flowchart of FIG. 21.

Figure 23:
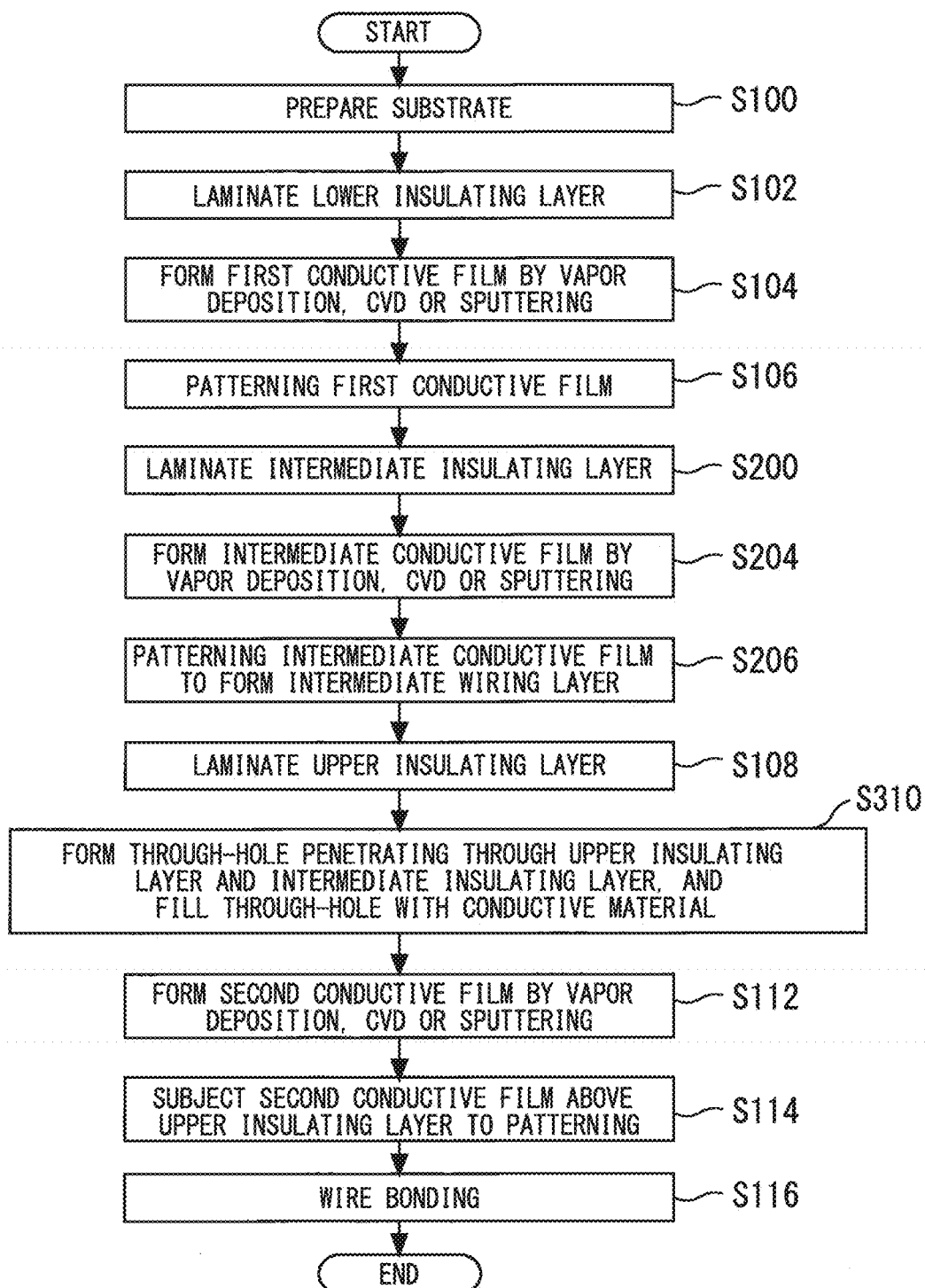
FIG. 23 is a flowchart showing a method of manufacturing a transformer and the semiconductor device according to the modification of the embodiment.

By further modifying the modification of FIG. 15, a through-hole penetrating through the intermediate insulating layer 2c and the upper insulating layer 2b may be formed by the same process. As a result, there is an advantage that the primary-side contact vias 26 and the secondary-side contact vias 36 are formed with less process. This further modification will be described with reference to FIG. 23. FIG. 23 is a flowchart showing a method of manufacturing the horizontal micro-transformer 110 and the semiconductor device 102 according to the modification of the embodiment. A first difference between the flowchart of FIG. 23 and the flowchart of FIG. 22 resides in that step S202 is omitted. A second difference between the flowchart of FIG. 23 and the flowchart of FIG. 22 resides in that the step S210 is replaced by step S310. After step S200, step S204 is executed without executing step S202. Therefore, there is a difference that the primary-side lower contact via 261 and the secondary-side lower contact via 361 are not formed. After step S108, step S310 is executed. In step S310, a through-hole penetrating through both the upper insulating layer 2b and the intermediate insulating layer 2c is provided, and the through-hole is filled with a conductor, thereby forming the primary-side contact via 26 and the secondary-side contact via 36.

According to the third modification described above, the dimension of the horizontal micro-transformer 110 can be increased in the z-direction. The signal transmission efficiency between the primary winding conductor 20 and the secondary winding conductor 30 can be enhanced while keeping the minuteness of the conductive wires constituting the primary winding conductor 20 and the secondary winding conductor 30. Furthermore, the adjustment of the inductance, etc. can be easily performed, so that the degree of freedom of design can be enhanced. The three-layer wiring structure is illustrated in the foregoing third modification. However, the horizontal micro-transformer 110 may be likewise provided even in the case of a multilayer wiring structure of four or more layers.

[Fourth Modification]

Figure 16:
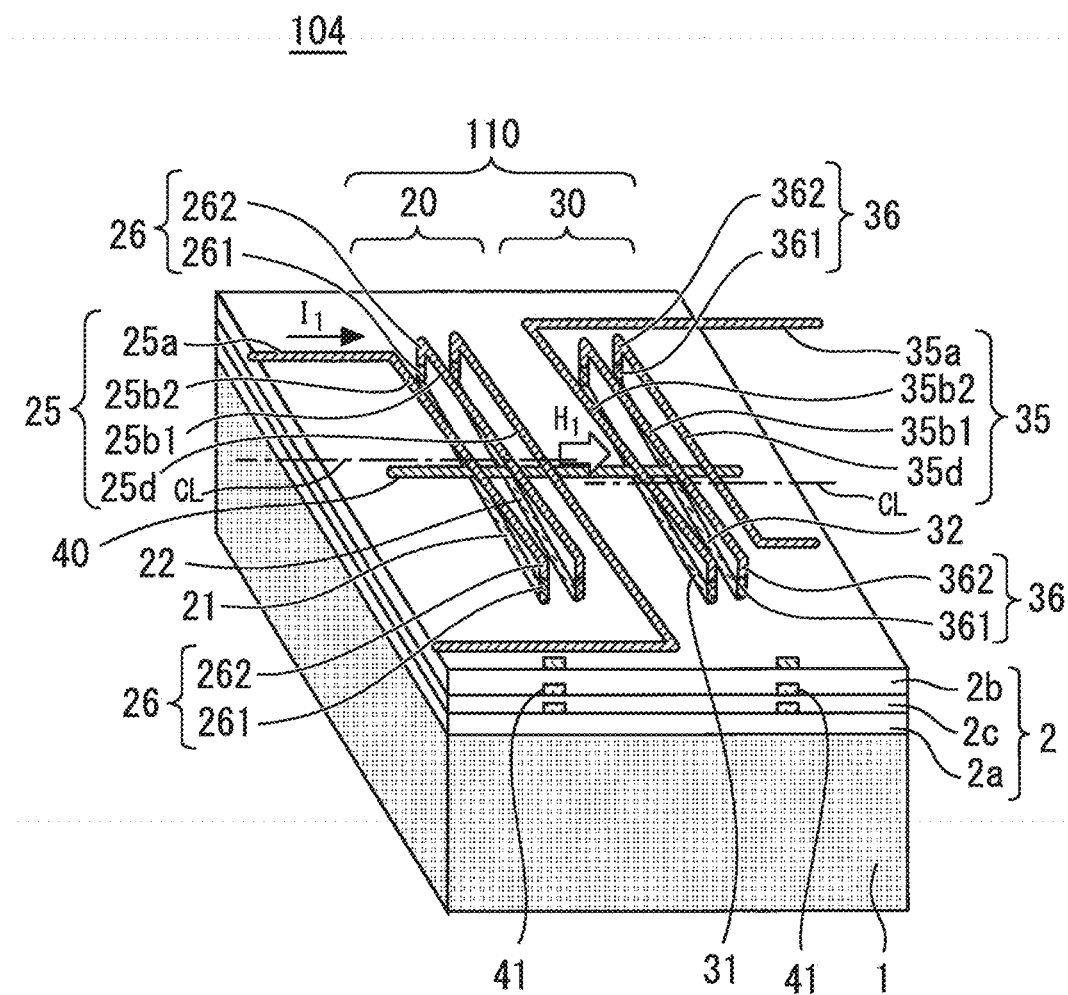
FIG. 16 is a perspective view showing a transformer according to a modification of the embodiment.

FIG. 16 is a perspective view showing a horizontal micro-transformer 110 according to a modification of the embodiment. The horizontal micro-transformer 110 according to the modification of FIG. 16 has a structure similar to the structure of FIG. 15 except for addition of a core linear body 40. The core linear body 40 is provided inside the insulating layer 2 so as to be inserted through the inside of the quadrangle spiral shape of the primary winding conductor 20 and the inside of the quadrangle spiral shape of the secondary winding conductor 30.

The core linear body 40 extends on the intermediate insulating layer 2c so as to sterically intersect with the first primary-side lower linear conductor 21 and the second primary-side lower linear conductor 22. Furthermore, the core linear body 40 extends on the intermediate insulating layer 2c so as to sterically intersect with the first secondary-side lower linear conductor 31 and the second secondary-side lower linear conductor 32. It is preferable that a high relative permeability material is used for the core linear body 40, and specifically it is preferable that a material having a relative permeability $\mu/\mu_0$ higher than 1 is used. Since the core linear body 40 acts as a core of the horizontal micro-transformer 110, that is, an iron core, the signal transmission efficiency can be enhanced.

Figure 24:
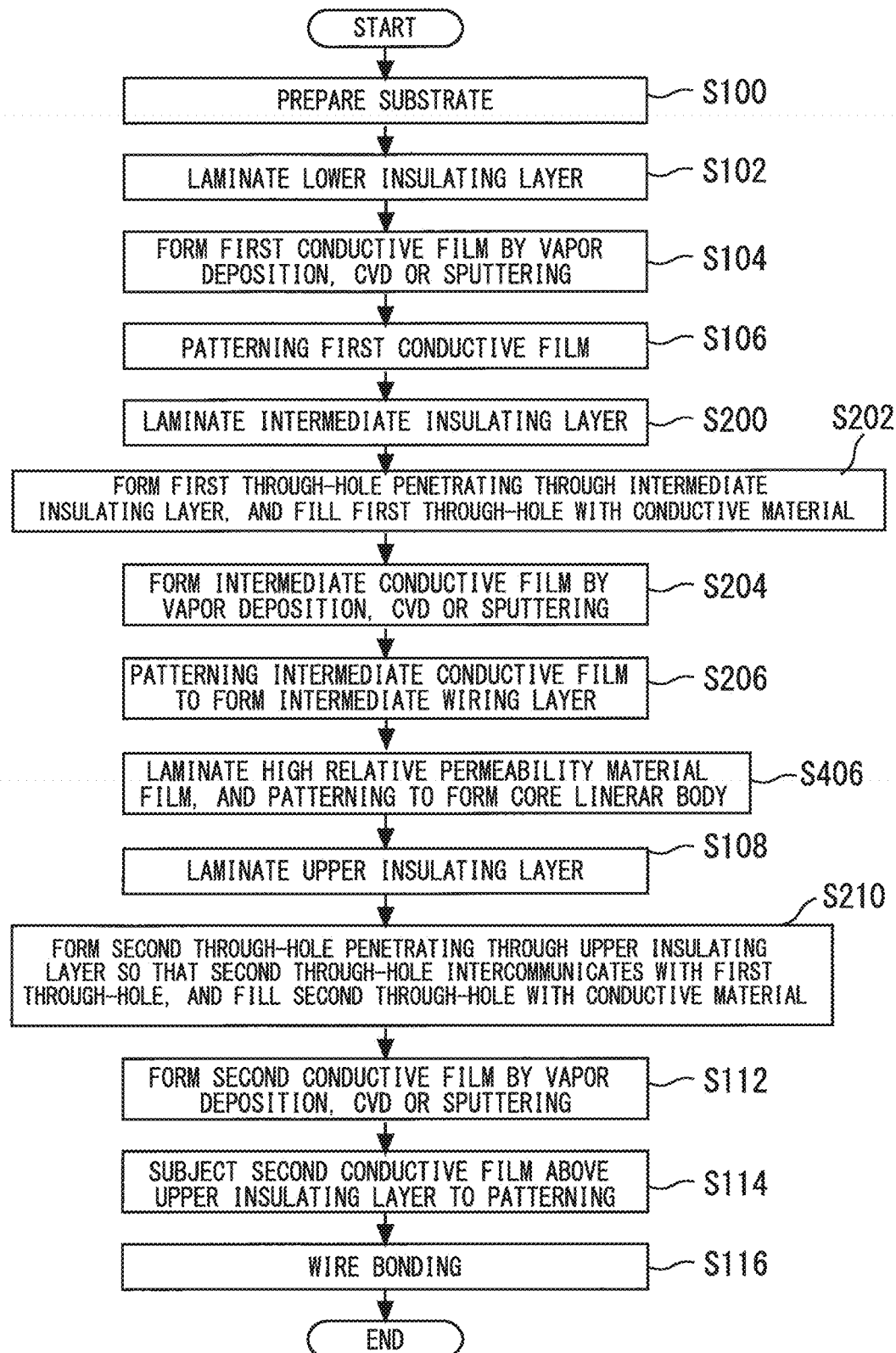
FIG. 24 is a flowchart showing a method of manufacturing a transformer and the semiconductor device according to the modification of the embodiment.
Figure 32:
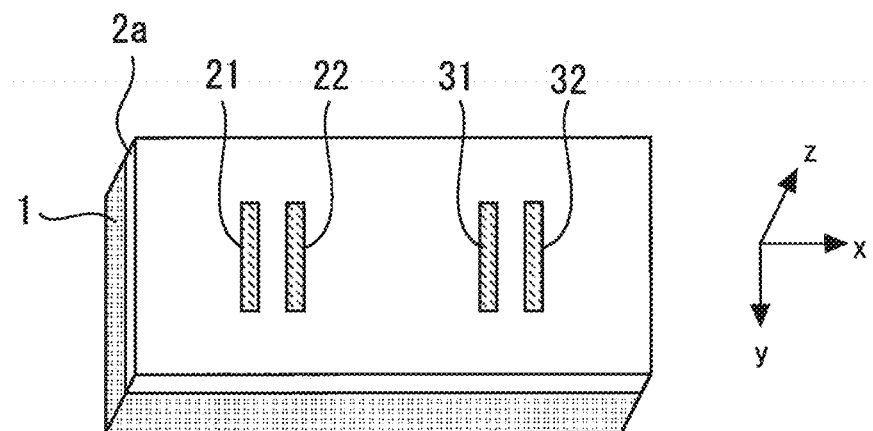
FIG. 32 is a manufacturing flow diagram showing the method of manufacturing a transformer according to the modification of the embodiment.
Figure 33:
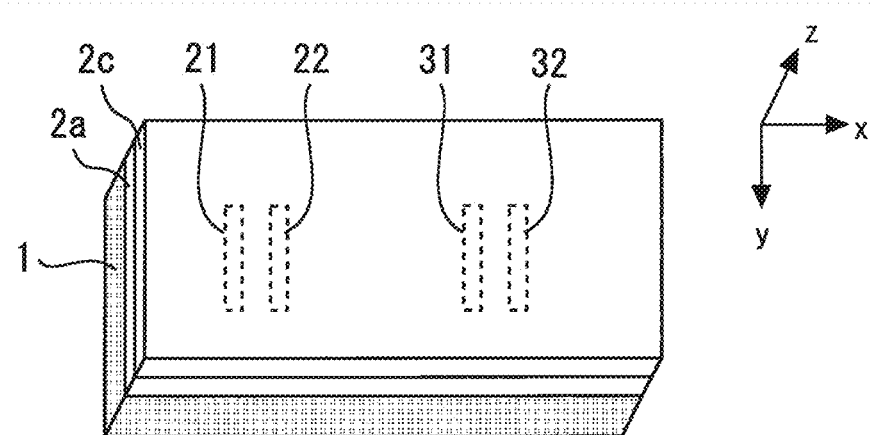
FIG. 33 is a manufacturing flow diagram showing the method of manufacturing a transformer according to the modification of the embodiment.

FIG. 24 is a flowchart showing a method of manufacturing the horizontal micro-transformer 110 and the semiconductor device 104 according to the modification of the embodiment. The flowchart of FIG. 24 has steps similar to the steps of FIG. 22 except for addition of step S406 between the steps S206 and S108. FIGS. 32 to 36 are manufacturing flow diagrams showing the method of manufacturing the horizontal micro-transformer 110 according to the modification of the embodiment. A structure shown in FIG. 32 is obtained by executing step S106. The intermediate insulating layer 2c is provided so as to cover the plural primary-side lower linear conductors 21, 22 and the plural secondary-side lower linear conductors 31, 32 by step S200. A structure shown in FIG. 33 is obtained by this step. Thereafter, step S202 is executed to form the primary-side contact vias 26 and the secondary-side contact vias 36. Next, step S204 is executed to form the intermediate conductive film. Next, in step S206, the intermediate wiring layer 41 is formed by subjecting the intermediate conductive film to patterning. These points are similar to those of the flowchart of FIG. 22.

Figure 34:
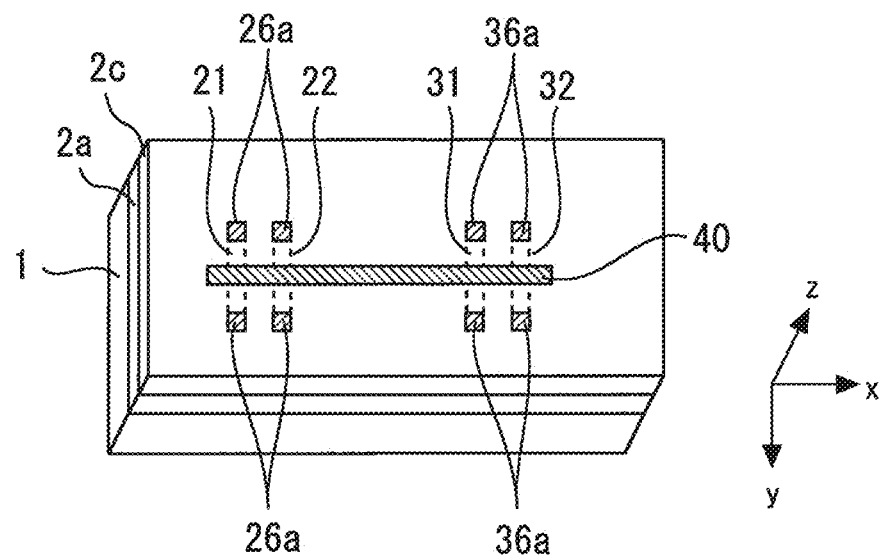
FIG. 34 is a manufacturing flow diagram showing the method of manufacturing a transformer according to the modification of the embodiment.

In step S406 of the flowchart of FIG. 24, the core linear body 40 is provided on the intermediate insulating layer 2c. In step S406, a film of a high relative permeability material as the material of the core linear body 40 is first formed. It is preferable that the high relative permeability material has a relative permeability higher than 1. Next, the film of the high relative permeability material is subjected to patterning to form the core linear body 40. The core linear body 40 formed by patterning extends so as to sterically intersect with each of the first primary-side lower linear conductor 21, the second primary-side lower linear conductor 22, the first secondary-side lower linear conductor 31 and the second secondary-side lower linear conductor 32. A structure of FIG. 34 is obtained in the stage where step S406 has been finished. In FIG. 34, the intermediate wiring layer 41 is omitted from the illustration.

Figure 35:
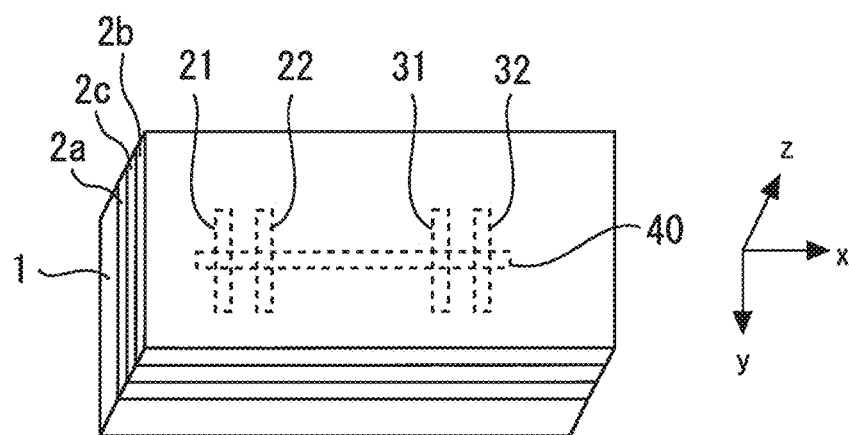
FIG. 35 is a manufacturing flow diagram showing the method of manufacturing a transformer according to the modification of the embodiment.

Next, step S108 and subsequent steps thereto are executed as in the case of the flowchart of FIG. 22. In step S108, the upper insulating layer 2b is provided on the intermediate insulating layer 2c so as to cover the core linear body 40. A structure of FIG. 35 is obtained by this step.

Figure 36:
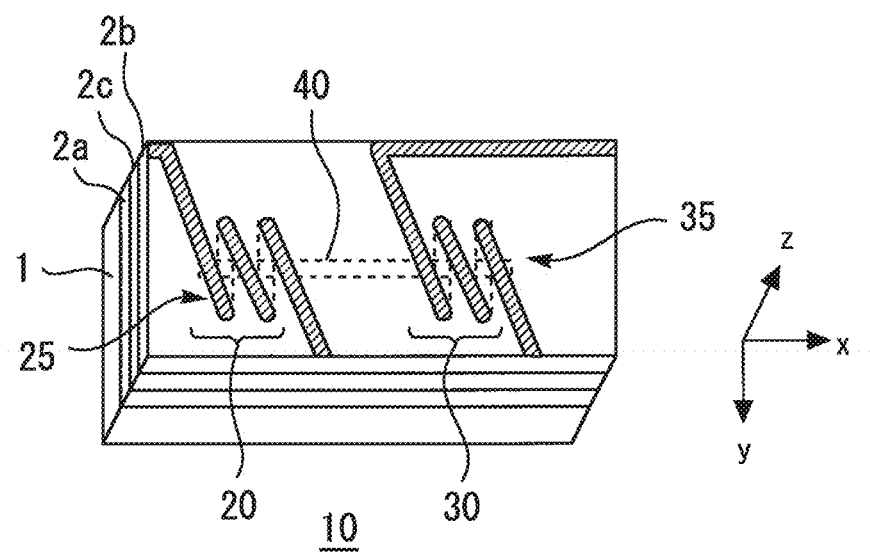
FIG. 36 is a manufacturing flow diagram showing the method of manufacturing a transformer according to the modification of the embodiment.

Next, primary-side upper contact vias 262 and secondary-side upper contact vias 362 are formed in step S210, whereby the primary-side contact vias 26 and the secondary-side contact vias 36 are completed. Next, steps S112 and S114 are executed, whereby the plural primary-side upper linear conductors 25 and the plural secondary-side upper linear conductors 35 are provided on the upper insulating layer 2b so as to sterically intersect with the core linear body 40. A structure of FIG. 36 is obtained by the steps S210, S112 and S114.

Figure 17:
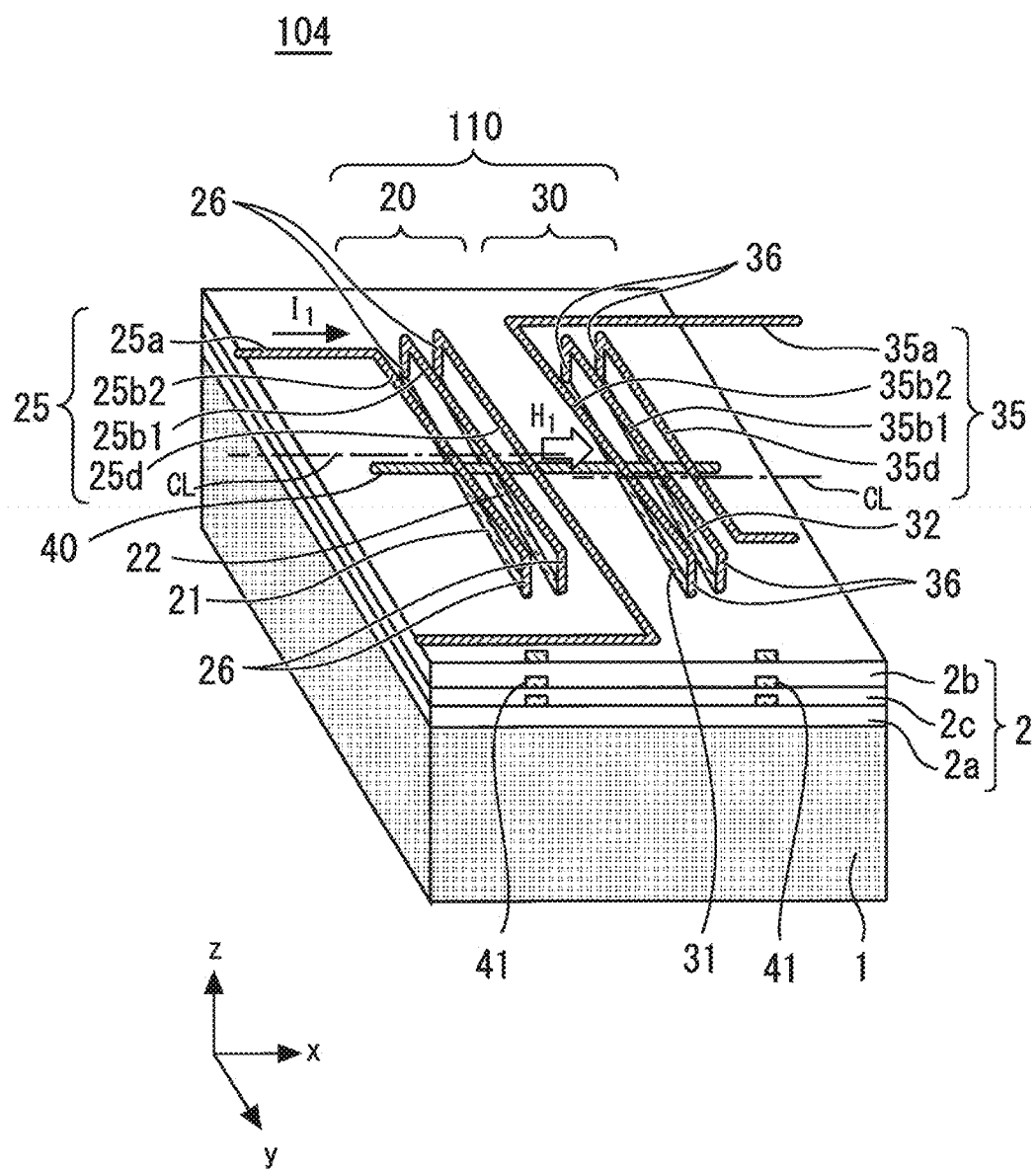
FIG. 17 is a perspective view showing a transformer according to a modification of the embodiment.

FIG. 17 is a perspective view showing the horizontal micro-transformer 110 according to the modification of the embodiment. The structural difference between FIG. 15 and FIG. 17 will be described. In the structure of FIG. 15, the primary-side lower contact via 261 and the primary-side upper contact via 262 are connected to each other to form the primary-side contact via 26, and the secondary-side lower contact via 361 and the secondary-side upper contact via 362 are connected to each other to form the secondary-side contact via 36. On the other hand, the horizontal micro-transformer 110 of FIG. 17 is different from the structure of FIG. 15 in that the primary-side contact via 26 and the secondary-side contact via 36 are single continuous vias, and these vies are provided by one-time via formation process.

Figure 25:
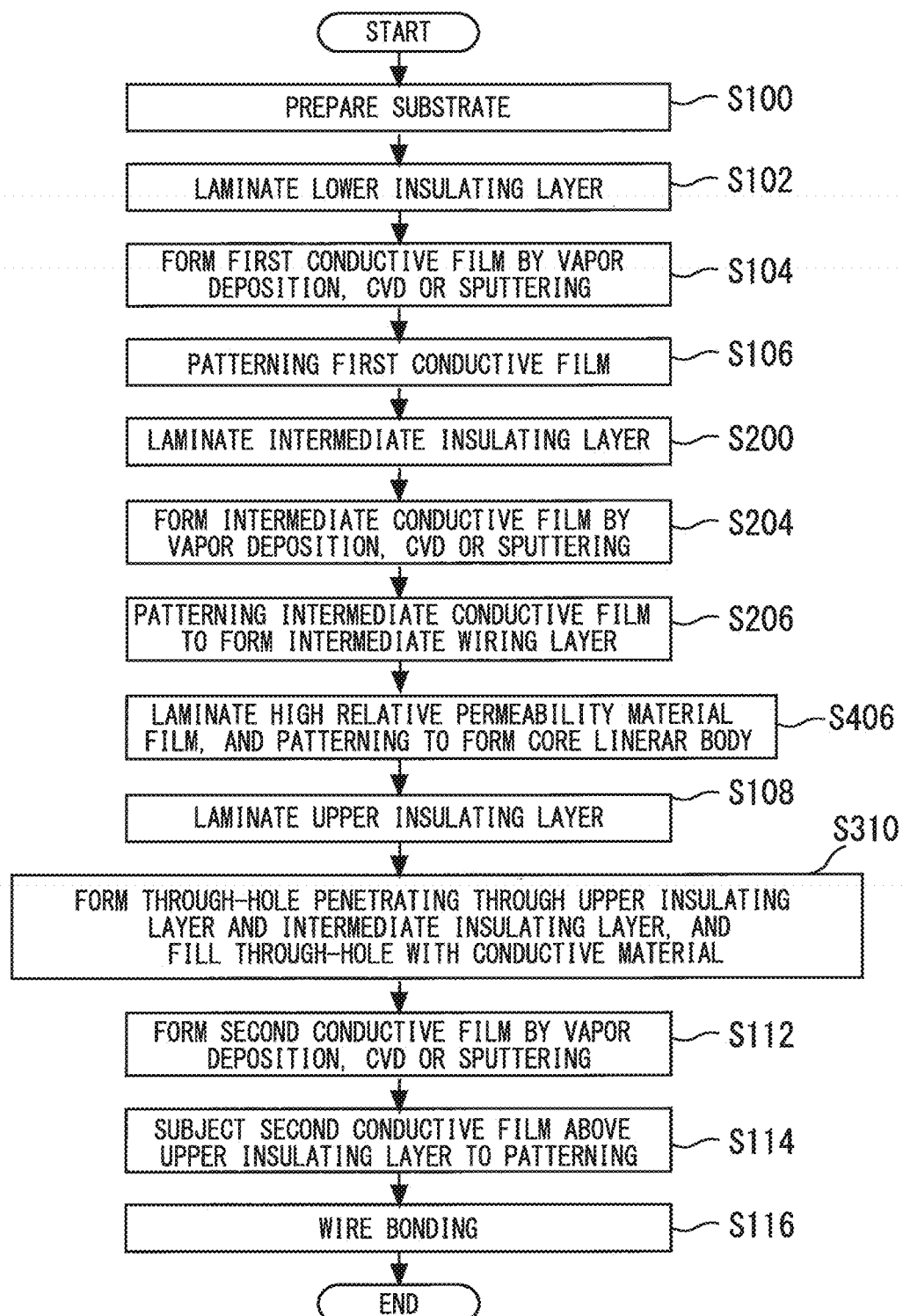
FIG. 25 is a flowchart showing a method of manufacturing a transformer and the semiconductor device according to the modification of the embodiment.
Figure 37:
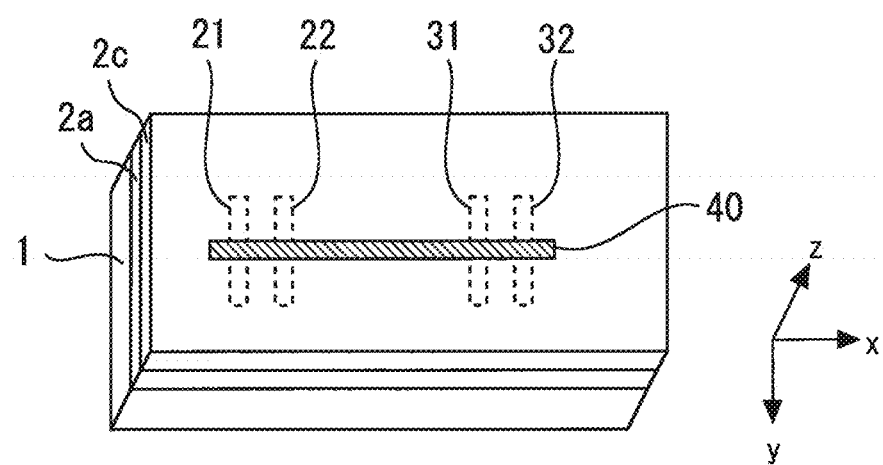
FIG. 37 is a manufacturing flow diagram showing the method of manufacturing a transformer according to the modification of the embodiment.

FIG. 25 is a flowchart showing the method of manufacturing the horizontal micro-transformer 110 and the semiconductor device 104 according to the modification of the embodiment. The flowchart of FIG. 25 is basically similar to the flowchart of FIG. 24, but different from the flowchart of FIG. 24 in that the step S202 is omitted and the step S210 is replaced by step S310. The flowchart of FIG. 25 executes similar steps to those of FIG. 23 in that the step S202 is omitted and the step S210 is replaced by the step S310. That is, the flowchart of FIG. 25 adds the step S406 after the step S206 in the flowchart of FIG. 23. FIG. 37 is a manufacturing flow diagram showing the method of manufacturing the horizontal micro-transformer 110 according to the modification of the embodiment. Since the step S202 is omitted in the flowchart of FIG. 25, neither the primary-side lower contact via 261 nor the secondary-side lower contact via 361 is formed. Accordingly, in the flowchart of FIG. 25, a structure of FIG. 37 is obtained in place of the structure of FIG. 34 in the stage where the step S406 has been finished.

The core linear body 40 according to the foregoing fourth modification may be combined with any of the first to third modifications described above.

[Fifth Modification]

Figure 18:
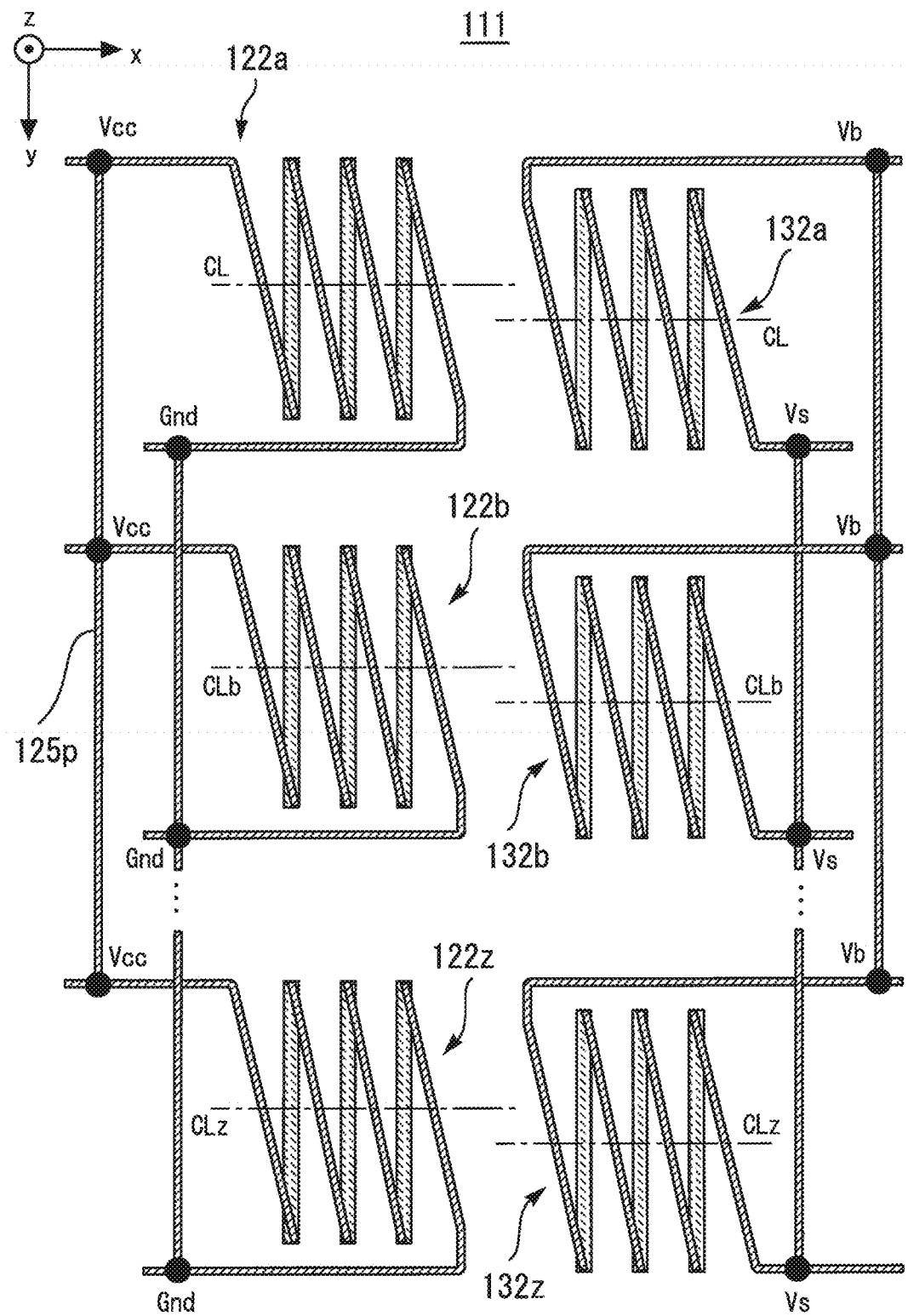
FIG. 18 is a plan view showing a transformer according to a modification of the embodiment.

FIG. 18 is a plan view showing a horizontal micro-transformer 111 according to a modification of the embodiment. In the modification of FIG. 18, the horizontal micro-transformer 110 includes a first primary winding conductor 122a and other primary winding conductors 122b and 122z. As omitted from FIG. 18, plural other primary winding conductors are actually further provided between the other primary winding conductor 122b and the other primary winding conductor 122z. In the modification of FIG. 18, the horizontal micro-transformer 110 includes a first secondary winding conductor 132a and other secondary winding conductors 132b and 132z. As omitted from FIG. 18, plural other secondary winding conductors are actually further provided between the other secondary winding conductor 132b and the other secondary winding conductor 132z.

The first primary winding conductor 122a corresponds to the primary winding conductor 20 in the embodiment, and the first secondary winding conductor 132a corresponds to the secondary winding conductor 30 in the embodiment. However, in the first primary winding conductor 122a and the first secondary winding conductor 132a, the winding number is set to 3. The other primary winding conductors 122b, 122z and the other secondary winding conductors 132b, 132z are spaced from the first primary winding conductor 122a and the first secondary winding conductor 132a in plan view of the semiconductor substrate 1. The other primary winding conductors 122b, 122z and the other secondary winding conductors 132b, 132z are provided in the quadrangle spiral shape inside the insulating layer 2 as in the case of the first primary winding conductor 122a and the first secondary winding conductor 132a. However, these conductors have different center axes, and the other primary winding conductor 122b and the other secondary winding conductor 132b have center axes CLb which are parallel with each other while the other primary winding conductor 122b and the other secondary winding conductor 132b have center axes CLz which are parallel with each other.

In FIG. 18, the other primary winding conductors 122b, 122z are connected in parallel with the first primary winding conductor 122a, and the other secondary winding conductors 132b, 132z are connected in parallel with the first secondary winding conductor 132a. In the first primary winding conductor 122a and the other primary winding conductors 122b, 122z, a first power source potential Vcc is applied to one end of each individual primary winding conductor, and a first reference potential Gnd is applied to another end of each individual primary winding conductor. The first power source potential Vcc is applied via a wiring 125p. In the first secondary winding conductor 132a and the other secondary winding conductors 132b, 132z, a second power source potential Vb is applied to one end of each individual secondary winding conductor, and a second reference potential Vs is applied to another end of each individual secondary winding conductor. Vs has a higher potential than Gnd, and Vb has a higher potential than Vcc. By performing the parallel connection as shown in FIG. 18, the current and the voltage required for signal transmission are made adjustable, so that the degree of freedom of design of the horizontal micro-transformer 111 and the semiconductor device 100 having the horizontal micro-transformer 111 is enhanced.

Figure 19:
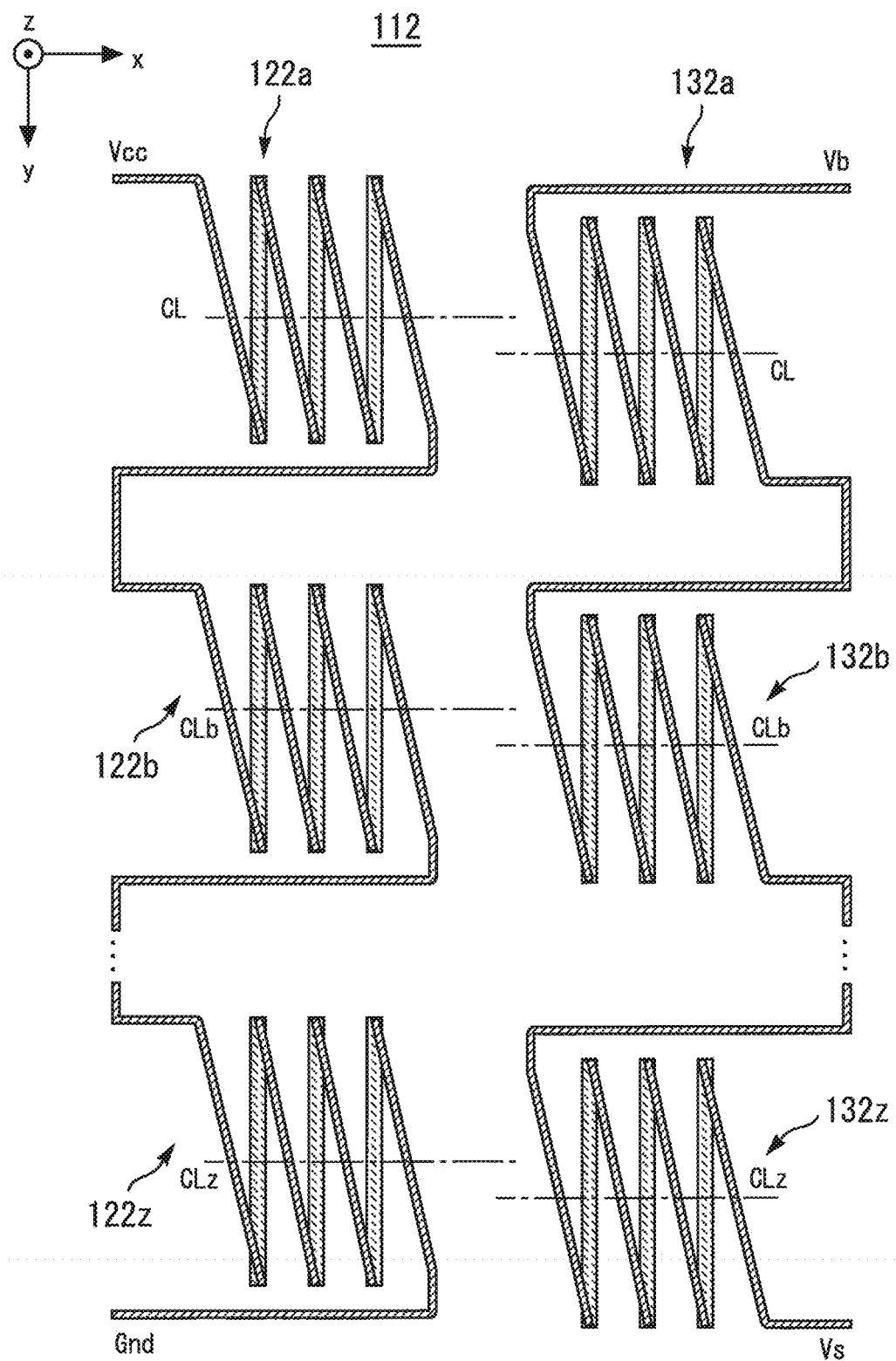
FIG. 19 is a plan view showing a transformer according to a modification of the embodiment.

FIG. 19 is a plan view of a horizontal micro-transformer 112 according to the modification of the embodiment. In FIG. 19, the other primary winding conductors 122b, 122z are connected in series with the first primary winding conductor 122a, and the other secondary winding conductors 132b, 132z are connected in series with the first secondary winding conductor 132a. FIG. 19 and FIG. 18 are different from each other in that FIG. 19 shows the series connection and FIG. 18 shows the parallel connection. The current and the voltage required for signal transmission are made also adjustable by performing the series connection as shown in FIG. 19, so that the degree of freedom of design of the horizontal micro-transformer 112 and the semiconductor device 100 having the same is enhanced.

In FIG. 18, the parallel connection of the primary winding conductors 122a, 122b, 122z may be changed to the series connection, and the secondary winding conductors 132a, 132b, 132z may be left in parallel connection. In FIG. 18, the primary winding conductors 122a, 122b, 122z may be left in parallel connection, and the parallel connection of the secondary winding conductors 132a, 132b, 132z may be changed to series connection. In this embodiment, the primary winding conductor 20 and the secondary winding conductor 30 are arranged in one-to-one correspondence relationship. However, in the fifth modification, a plurality of pairs of plural primary winding conductors 20 and plural secondary winding conductors 30 are formed, and these pairs are connected in series or parallel with one another. A plurality of winding conductors may be formed for either the primary winding conductor 20 or the secondary winding conductor 30, or for both the primary winding conductor 20 and the secondary winding conductor 30.

Figure 20:
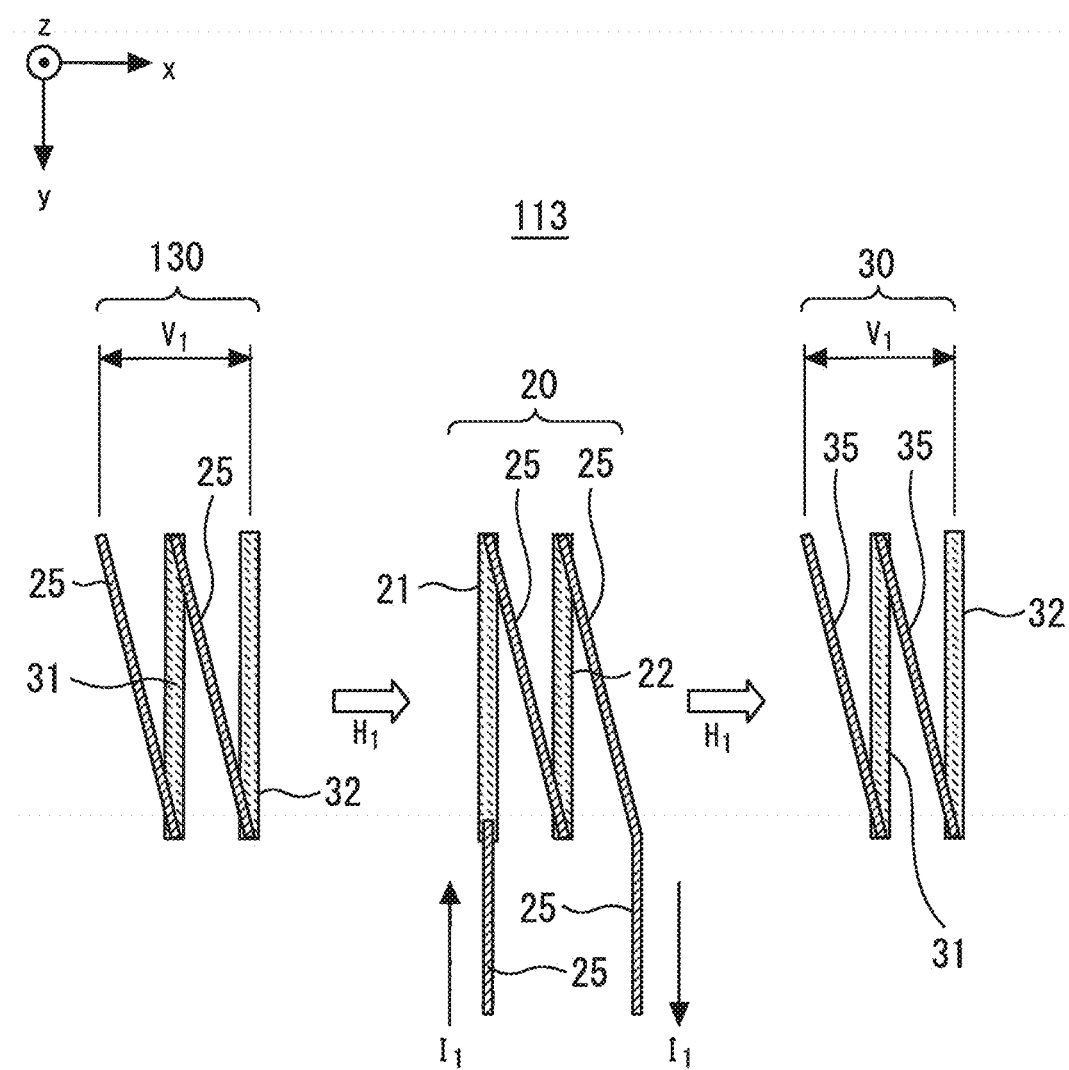
FIG. 20 is a plan view showing a transformer according to a modification of the embodiment.

FIG. 20 is a plan view of a horizontal micro-transformer 113 according to the modification of the embodiment. In FIG. 20, the primary winding conductor 20 is sandwiched between another secondary winding conductor 130 and the secondary winding conductor 30 in plan view of the semiconductor substrate 1. Magnetic field emitted from both sides of the primary winding conductor 20 can be received by plural secondary winding conductors including the other secondary winding conductor 130 and the secondary winding conductor 30, so that the signal transmission efficiency can be enhanced.

The other primary winding conductors 122b, 122z correspond to a "first additional winding conductors". The other secondary winding conductors 132b, 132z correspond to a "second additional winding conductors". The other secondary winding conductor 130 corresponds to a "third additional winding conductor".

The increase of the number of winding conductors and the circuit configuration according to the fifth modification described above may be combined with any of the first modification to the fourth modification described above.

The features and advantages of the present disclosure (or embodiments) may be summarized as follows. According to the present disclosure, the winding conductor constituting the transformer has the quadrangle spiral shape. The winding conductor having the quadrangle spiral shape can be formed by connecting the linear conductors parallel to the plane direction of the insulating layer and the contact vias vertical to the insulating layer. The linear conductors and the contact vias may be formed by forming a conductor film according to a vacuum deposition method, a chemical vapor deposition method or sputtering as in the case of the wiring formation process of the semiconductor device. Since the winding conductor can be formed by the process similar to the wiring formation process of the semiconductor device, the manufacturing efficiency of the transformer can be enhanced.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-242902, filed on Dec. 19, 2017 including specification, claims, drawings and summary, on which the Convention priority of the present application is based, is incorporated herein by reference in its entirety.

What is claimed is:

1. A transformer manufacturing method comprising the steps of:

laminating a lower insulating layer on a surface of a semiconductor substrate;

laminating a first conductor film on the lower insulating layer by a vacuum deposition method, a chemical vapor deposition method or sputtering;

subjecting the first conductor film to patterning to form a first lower linear conductor and a second lower linear conductor that are arranged side by side so as to be spaced from each other in plan view of the semiconductor substrate, and to form a third lower linear conductor and a fourth lower linear conductor that are arranged side by side so as to be spaced from each other in plan view of the semiconductor substrate;

laminating an upper insulating layer on the lower insulating layer in which the first through fourth lower linear conductors are formed;

providing a plurality of contact vias penetrating through the upper insulating layer so that the plurality of contact vias reach a first end and a second end of the first lower linear conductor, a third end and a fourth end of the second lower linear conductor, a fifth end and a sixth end of the third lower linear conductor, and a seventh end and an eighth end of the fourth lower linear conductor, the first end being adjacent to the third end, the second end being adjacent to the fourth end, the fifth end being adjacent to the seventh end, and the sixth end being adjacent to the eighth end;

laminating a second conductor film on the upper insulating layer by the vacuum deposition method, the chemical vapor deposition method or the sputtering; and subjecting the second conductor film to patterning to form a first upper linear conductor, a second upper linear conductor, a third upper linear conductor, and a fourth upper linear conductor so that the first through fourth upper linear conductors are in contact with the plurality of contact vias, wherein the first upper linear conductor is formed so as to connect a first contact via positioned at the first end of the first lower linear conductor to a second contact via positioned at the fourth end of the second lower linear conductor, the second upper linear conductor is formed so as to connect with a third contact via positioned at the second end of the first lower linear conductor, the third upper linear conductor is formed so as to connect a fourth contact via positioned at the fifth end of the third lower linear conductor to a fifth contact via positioned at the eighth end of the fourth lower linear conductor, the fourth upper linear conductor is formed so as to connect with a sixth contact via positioned at the sixth end of the third lower linear conductor, the first lower linear conductor, the second lower linear conductor, the first upper linear conductor and the second upper linear conductor are connected to one another via the plurality of contact vias, thereby forming a first winding conductor having a first center axis, the third lower linear conductor, the fourth lower linear conductor, the third upper linear conductor and the fourth upper linear conductor are connected to one another via the plurality of contact vias, thereby forming a second winding conductor having a second center axis, each of the first and second winding conductors have a quadrangle spiral shape having a respective center axis extending in a direction parallel to the surface of the semiconductor substrate, the first and second winding conductors are spaced from one another and are magnetically coupled to each other, and the second winding conductor encircles the first center axis and the first winding conductor encircles the second center axis, the second center axis being offset from the first center axis in a direction perpendicular to the first center axis.

2. The transformer manufacturing method according to claim 1, further comprising the steps of:
providing an intermediate insulating layer so as to cover the first through fourth lower linear conductors before the upper insulating layer is laminated; and
providing a core linear body on the intermediate insulating layer so that the core linear body extends so as to sterically intersect with the first through fourth lower linear conductors, wherein the upper insulating layer is provided on the intermediate insulating layer so as to cover the core linear body, and the first through the fourth upper linear conductors are provided on the upper insulating layer so as to sterically intersect with the core linear body.

3. The semiconductor device according to claim 1, wherein
at least one of a winding number and a width is different between the first winding conductor and the second winding conductor.

4. A transformer comprising:
a semiconductor substrate;
an insulating layer laminated on a surface of the semiconductor substrate;
a primary winding conductor that is provided in the insulating layer and is provided in a first quadrangle spiral shape having a first center axis extending in a direction parallel to the surface of the semiconductor substrate, and configured by a conductor film selected from a group consisting of a vacuum deposition film, a chemical vapor deposition film and a sputtered film; and
a secondary winding conductor that is provided in the insulating layer and is provided in a second quadrangle spiral shape having a second center axis extending in the direction parallel to the surface of the semiconductor substrate while being spaced from the primary winding conductor in plan view of the semiconductor substrate, magnetically coupled with the primary winding conductor and configured by the conductor film selected from the group, wherein the secondary winding encircles the first center axis and the primary winding encircles the second center axis, the second center axis being offset from the first center axis in a direction perpendicular to the first center axis.

5. The transformer according to claim 4, wherein the insulating layer includes a lower insulating layer laminated on the semiconductor substrate, and an upper insulating layer laminated on the lower insulating layer, the primary winding conductor includes a plurality of primary-side lower linear conductors provided between the lower insulating layer and the upper insulating layer, a plurality of primary-side contact vias penetrating through the upper insulating layer at both end portions of each of the plurality of primary-side lower linear conductors, and a plurality of primary-side upper linear conductors that are provided on the upper insulating layer and connect with the plurality of primary-side contact vias to configure the first quadrangle spiral shape together with the plurality of primary-side lower linear conductors and the plurality of primary-side contact vias, and the secondary winding conductor includes a plurality of secondary-side lower linear conductors provided between the lower insulating layer and the upper insulating layer, a plurality of secondary-side contact vias penetrating through the upper insulating layer at both end portions of each of the plurality of secondary-side lower linear conductors, and a plurality of secondary-side upper linear conductors that are provided on the upper insulating layer and connect with the plurality of secondary-side contact vias to configure the second quadrangle spiral shape together with the plurality of secondary-side lower linear conductors and the plurality of secondary-side contact vias.

6. The transformer according to claim 4, further comprising a core linear body provided inside the insulating layer so that the core linear body is inserted through an inside of the first quadrangle spiral shape of the primary winding conductor and an inside of the second quadrangle spiral shape of the secondary winding conductor.

7. The transformer according to claim 4, further comprising an additional winding conductor that is provided in the insulating layer and is provided in a third quadrangle spiral shape having a third center axis extending in the direction parallel to the surface of the semiconductor substrate while being spaced from the primary winding conductor and the secondary winding conductor in plan view of the semiconductor substrate, and is configured by the conductor film.

8. The transformer according to claim 7, wherein the additional winding conductor is connected in parallel with the primary winding conductor.

9. The transformer according to claim 7, wherein the additional winding conductor is connected in series with the primary winding conductor.

10. The semiconductor device according to claim 4, wherein
at least one of a winding number and a width is different between the primary winding and the secondary winding.

11. A transformer comprising:
a semiconductor substrate;
an insulating layer laminated on a surface of the semiconductor substrate;
a primary winding conductor that is provided in the insulating layer and is provided in a first quadrangle spiral shape having a first center axis extending in a direction parallel to the surface of the semiconductor substrate, and configured by a conductor film selected from a group consisting of a vacuum deposition film, a chemical vapor deposition film and a sputtered film;

a secondary winding conductor that is provided in the insulating layer and is provided in a second quadrangle spiral shape having a second center axis extending in the direction parallel to the surface of the semiconductor substrate while being spaced from the primary winding conductor in plan view of the semiconductor substrate, magnetically coupled with the primary winding conductor and configured by the conductor film selected from the group, and the second center axis being offset from the first center axis in a direction perpendicular to the first center axis, and an additional winding conductor that is provided in the insulating layer and is provided in a third quadrangle spiral shape having a third center axis extending in the direction parallel to the surface of the semiconductor substrate while being spaced from the primary winding conductor and the secondary winding conductor in plan view of the semiconductor substrate, and is configured by the conductor film, wherein the primary winding conductor is sandwiched between the additional winding conductor and the secondary winding conductor in plan view of the semiconductor substrate.

12. The semiconductor device according to claim 11, wherein
at least one of a winding number and a width is different between the primary winding conductor and the secondary winding conductor.

13. A semiconductor device comprising:
a semiconductor substrate;
an insulating layer laminated at a first part of a surface of the semiconductor substrate;
a transformer formed in the insulating layer;
a low potential side circuit and a high potential side circuit provided on a second part of the surface of the semiconductor substrate; and
a wiring provided on the second part of the surface of the semiconductor substrate, wherein
the transformer includes a primary winding conductor that is provided in the insulating layer and is provided in a first quadrangle spiral shape having a first center axis extending in a direction parallel to the surface of the semiconductor substrate, and a secondary winding conductor that is provided in the insulating layer and is provided in a second quadrangle spiral shape having a second center axis extending in the direction parallel to the surface of the semiconductor substrate while being spaced from the primary winding conductor in plan view of the semiconductor substrate, and magnetically coupled with the primary winding conductor, the second center axis being offset from the first center axis in a direction perpendicular to the first center axis,
the wiring of the low potential side is electrically connected to the primary winding and the wiring of the high potential side is electrically connected to the secondary winding, and
the wiring, the primary winding conductor and the secondary winding conductor are configured by a conductor film selected from a group consisting of a vacuum deposition film, a chemical vapor deposition film and a sputtered film.

14. The semiconductor device according to claim 13, wherein
the secondary winding encircles the first center axis, and the primary winding encircles the second center axis.

15. The semiconductor device according to claim 13, wherein
at least one of a winding number and a width is different between the primary winding conductor and the secondary winding conductor.

* * * * *